(12) United States Patent
Ogawa

(10) Patent No.: US 10,546,710 B2
(45) Date of Patent: Jan. 28, 2020

(54) FUSE PRODUCTION METHOD, FUSE, CIRCUIT BOARD PRODUCTION METHOD AND CIRCUIT BOARD

(71) Applicant: SOC Corporation, Tokyo (JP)

(72) Inventor: Toshitaka Ogawa, Tochigi (JP)

(73) Assignee: SOC Corporation, Tokyo (JP)

( * ) Notice: Subject to any disclaimer, the term of this patent is extended or adjusted under 35 U.S.C. 154(b) by 30 days.

(21) Appl. No.: 15/726,373

(22) Filed: Oct. 5, 2017

(65) Prior Publication Data

US 2018/0033578 A1 Feb. 1, 2018

Related U.S. Application Data

(63) Continuation of application No. PCT/JP2015/060874, filed on Apr. 7, 2015.

(51) Int. Cl.
*H01H 85/055* (2006.01)
*H01H 85/02* (2006.01)
*H01H 85/046* (2006.01)
*H01H 69/02* (2006.01)
*H05K 1/03* (2006.01)
(Continued)

(52) U.S. Cl.
CPC ........ *H01H 85/0241* (2013.01); *H01H 69/02* (2013.01); *H01H 69/022* (2013.01); *H01H 85/046* (2013.01); *H01H 85/055* (2013.01); *H05K 1/0313* (2013.01); *H05K 1/097* (2013.01); *H05K 3/10* (2013.01);
(Continued)

(58) Field of Classification Search
CPC .. H01H 85/08; H01H 85/0241; H01H 85/046; H01H 85/055; H01H 2085/0275; H01H 69/02; H01H 69/022; H01H 2300/036; H05K 1/0313; H05K 1/097; H05K 3/10; H05K 2203/1131
USPC .......................................................... 337/297
See application file for complete search history.

(56) References Cited

U.S. PATENT DOCUMENTS 5,726,621 A * 3/1998 Whitney ............ H01H 85/0411
337/283
5,929,741 A * 7/1999 Nishimura ......... H01H 85/0411
337/159
(Continued)

FOREIGN PATENT DOCUMENTS

JP 2000284467 10/2000
JP 2006-339105 12/2006
(Continued)

OTHER PUBLICATIONS

"Office Action of Japan Counterpart Application" with English translation thereof, dated Dec. 5, 2017, p. 1-p. 11.
(Continued)

*Primary Examiner* — Jacob R Crum
(74) *Attorney, Agent, or Firm* — JCIPRNET

(57) ABSTRACT

A fuse production method includes the steps of forming a liquid film of a dispersion liquid, in which metal nanoparticles are dispersed in a solvent, on a principal surface of a substrate containing at least an organic substance, heating the liquid film so as to vaporize the solvent to melt or sinter the metal nanoparticles and to soften or melt the principal surface, and forming a fuse film on the principal surface by fusing the melted or sintered metal nanoparticles and the softened or melted principal surface with each other.

6 Claims, 27 Drawing Sheets

(51) Int. Cl.
*H05K 1/09* (2006.01)
*H05K 3/10* (2006.01)

(52) U.S. Cl.
CPC .............. *H01H 2085/0275* (2013.01); *H01H 2300/036* (2013.01); *H05K 2203/1131* (2013.01)

(56) References Cited

U.S. PATENT DOCUMENTS

| | | | |
|---|---|---|---|
| 6,198,376 B1* | 3/2001 | Ishikawa | H01H 37/761 337/159 |
| 2005/0141164 A1 | 6/2005 | Bender et al. | |
| 2005/0148111 A1* | 7/2005 | Mortan | H05K 3/3436 438/106 |
| 2006/0116000 A1* | 6/2006 | Yamamoto | H01L 21/02126 438/795 |
| 2008/0268663 A1* | 10/2008 | Ales | H01R 13/03 439/37 |
| 2010/0132980 A1* | 6/2010 | Takahashi | H05K 1/142 174/250 |
| 2013/0118792 A1* | 5/2013 | Min | H05K 1/02 174/262 |
| 2015/0245479 A1 | 8/2015 | Usami et al. | |

FOREIGN PATENT DOCUMENTS

| | | |
|---|---|---|
| JP | 2007-165086 | 6/2007 |
| JP | 2008-200875 | 9/2008 |
| JP | 2008235388 | 10/2008 |
| JP | 2009283783 | 12/2009 |
| JP | 2012018777 | 1/2012 |
| JP | 2014-132565 | 7/2014 |
| JP | 2014192465 | 10/2014 |
| WO | 2013146389 | 10/2013 |

OTHER PUBLICATIONS

"International Preliminary Report on Patentability; this report contains the following items :Form PCT/IB/326, PCT/IB/373, PCT/IB/338, PCT/ISA237(cover sheet), PCT/ISA237 (Box No. I),PCT/ISA237(Box No. V),", dated Oct. 19, 2017, which is English translation of "Written Opinion of the International Searching Authority", p. 1-p. 11.

"Search Report of Europe Counterpart Application", dated Nov. 2, 2018, p. 1-p. 5.

* cited by examiner

FUSE PRODUCTION METHOD, FUSE, CIRCUIT BOARD PRODUCTION METHOD AND CIRCUIT BOARD

CROSS-REFERENCE TO RELATED APPLICATIONS

The present application is a continuation application of International Application number PCT/JP2015/060874, filed on Apr. 7, 2015. The content of this application is incorporated herein by reference in its entirety.

BACKGROUND OF THE INVENTION

The present invention relates to a fuse production method, a fuse, a circuit board production method and a circuit board.

Fuses are used to prevent the occurrence of circuit breakdown due to an inflow of excess current caused by a failure, or the like, in an electronic device. Specifically, a fuse has a fuse film bonded to a substrate, and when an abnormal current flows in a circuit, the fuse film is blown to cut off the circuit to prevent the circuit from being broken.

When a bonding between the substrate and the fuse film is weak, there is a possibility that the fuse film is peeled from the substrate and breaks even when no abnormal current flows. In particular, since conduction occurs repeatedly through the fuse film, expansion and contraction of the fuse film frequently occurs between the fuse film and the substrate because the fuse film and the substrate have a different expansion coefficient with respect to the rise in temperature, and so the fuse film is easily peeled from the substrate. Therefore, there is a demand to firmly bond the fuse film to the substrate in order to prevent the fuse film from being peeled off.

Patent Document 1 (Japanese Patent Application Publication No. 2008-200875) proposes, in order to enhance an adhesion between an insulating substrate and a metal thin film in a circuit board, a method of causing a metal oxide to exist at a contact interface between an insulating resin layer, which exists between the insulating substrate and the metal thin film, and the metal thin film.

As electronic devices incorporating fuses are becoming smaller and lighter, further downsizing and weight reduction of the fuses are required. However, when the technique of Patent Document 1 is applied to a small fuse, it is necessary to make the surface roughness of the contact interface between the insulating resin layer and the metal thin film be 100 (nm) or less, which incurs a great cost.

Further, the production method disclosed in Patent Document 1 includes performing a heat treatment in an atmosphere containing an oxidizing agent. On this occasion, it is necessary to adjust the oxygen concentration to about 20 to 2000 (ppm), which requires expensive equipment.

BRIEF SUMMARY OF THE INVENTION

This invention focuses on these points, and the invention produces a fuse whose fuse film is resistant to being peeled from a substrate at a low cost.

One aspect of the present invention provides a fuse production method comprising the steps of forming a liquid film of a dispersion liquid, in which metal nanoparticles are dispersed in a solvent, on a principal surface of a substrate containing at least an organic substance, heating the liquid film so as to vaporize the solvent to melt or sinter the metal nanoparticles and to soften or melt the principal surface, and forming a fuse film on the principal surface by fusing the melted or sintered metal nanoparticles and the softened or melted principal surface with each other.

DETAILED DESCRIPTION OF THE INVENTION

Figure 1:
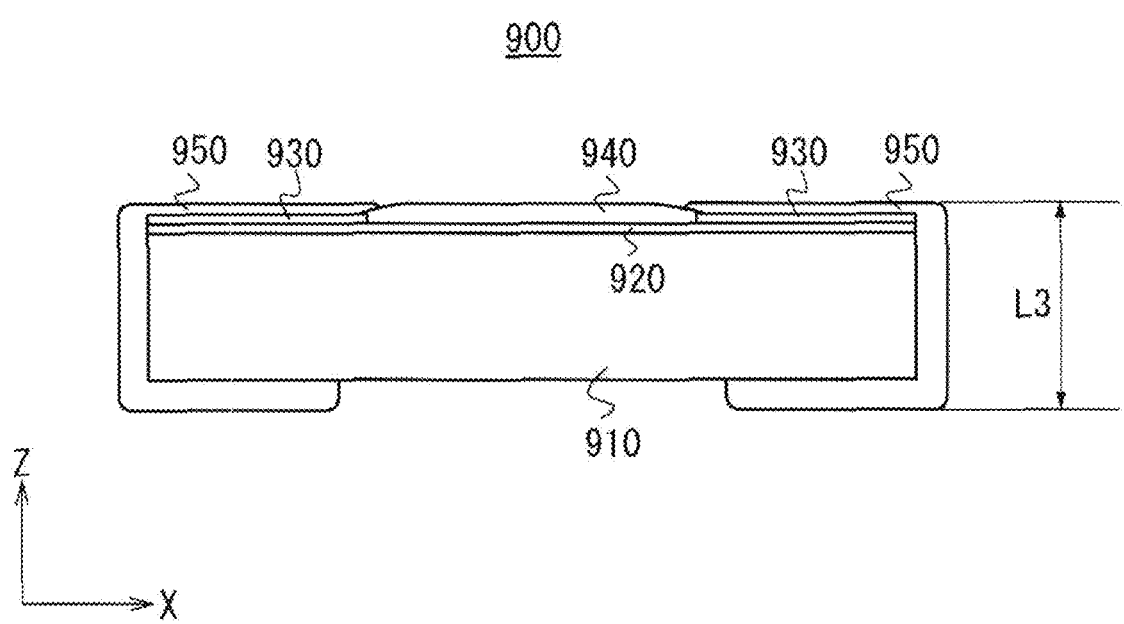
FIG. 1 is a schematic cross-sectional view of a fuse 900 according to comparative example 1.

In the following, the description will be given in the order indicated below.

1. Comparative Example
1-1. Configuration of fuse according to comparative example
1-2. Pulse life test
1-3. Heat cycle test
1-4. Peeling of fuse film
1-5. Peeling of internal terminal
2. Configuration of fuse
3. Fuse production method
4. Variation
5. Configuration of circuit board
6. Circuit board production method

1. Comparative Example

A fuse according to a comparative example is described before the description of a fuse according to the present invention. Hereinafter, the configuration of the fuse according to the comparative example is described, and then problems that occur in the fuse according to the comparative example are described.

(1-1. Configuration of Fuse According to Comparative Example)

Figure 2:
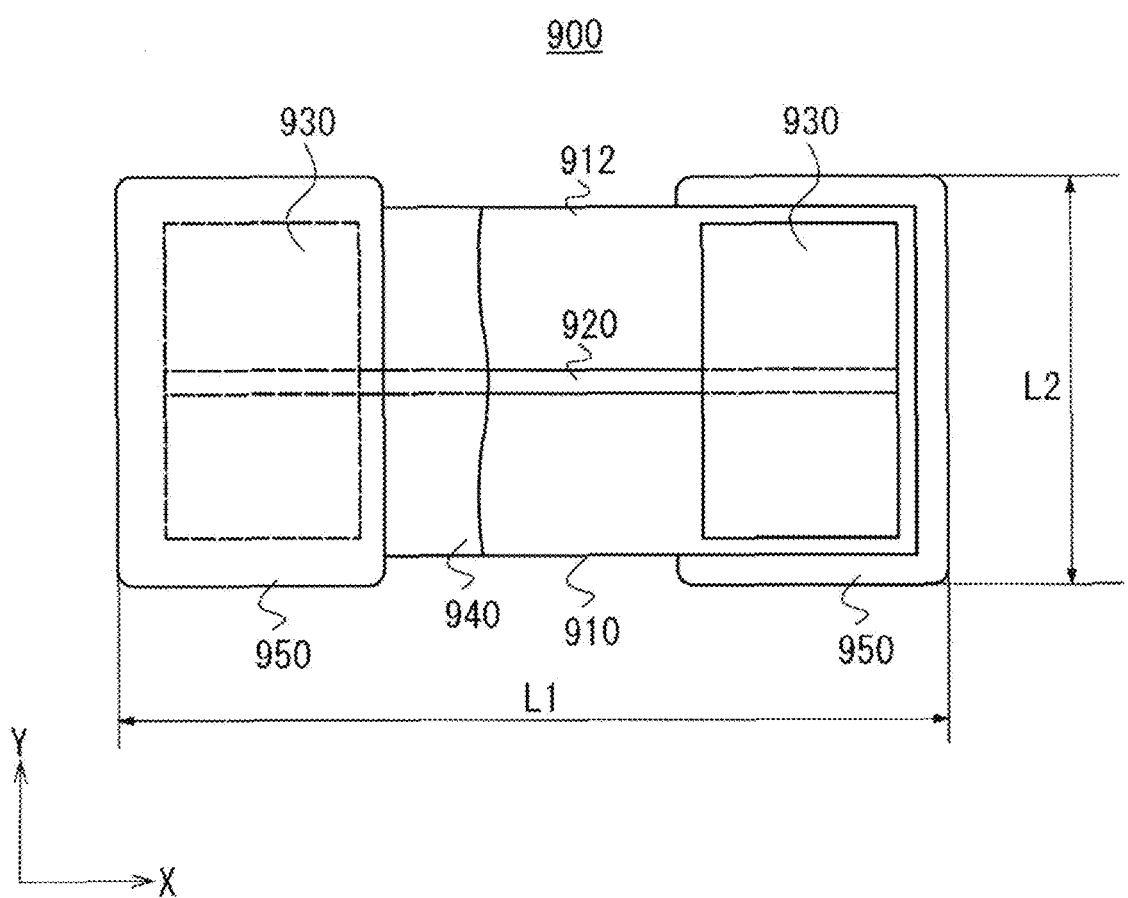
FIG. 2 is a schematic planar view of the fuse 900.

FIG. 1 is a schematic cross-sectional view of a fuse 900 according to comparative example 1. FIG. 2 is a schematic planar view of the fuse 900. As shown in FIG. 1 and FIG. 2, the fuse 900 according to comparative example 1 includes a support substrate 910, a fuse film 920, internal terminals 930, an overcoat 940, and external terminals 950.

The fuse 900 is inserted into a circuit in series and, for example, when an excess current flows into the circuit, the fuse film 920 is blown to protect the circuit. The length L1 of the fuse 900 in the longitudinal direction is about 1.6 (mm), the length L2 of the fuse 900 in the width direction is about 0.8 (mm), and the thickness L3 of the fuse 900 is about 0.7 (mm). Further, the weight of the fuse 900 is about 1.7 (mg).

The support substrate 910 supports the fuse film 920 and the internal terminals 930. The support substrate 910 is a substrate consisting of an organic compound such as an epoxy substrate containing fiberglass. The fuse film 920 is formed on a principal surface 912 of the support substrate 910. The fuse film 920 is a conductor and the fuse film 920 herein is made of silver. Each end of the fuse film 920 in the longitudinal direction is electrically connected to an internal terminal 930.

The internal terminals 930 are conductors and are formed at each end of the fuse film 920 in the longitudinal direction on the principal surface 912 of the support substrate 910. The overcoat 940 coats the fuse film 920 and a portion of the internal terminals 930. The overcoat 940 is made of, for example, epoxy resin. The external terminals 950 are made of, for example, silver and are formed on the internal terminals 930 so as to be connected to the internal terminals 930.

In the fuse 900, a rush current (also referred to as an inrush current) may occur at the time of switching on and off the power supply to the circuit. The rush current may occur due to, for example, charging and discharging of a capacitor inserted in the circuit. The rush current generally has a spike-shaped current waveform, and has a characteristic that the current peak is high and the conduction time is short. Also, the fuse 900, which should not be blown, is sometimes blown in some cases due to the rush current.

For this reason, the fuse 900 is required to be blown when an abnormal current flows, but it is required to resist the rush current and not to be blown by the rush current. As a test method of the durability of the fuse 900 against the rush current, a pulse life test that inputs a predetermined pulse waveform to the fuse 900 is used. Durability against the rush current can be evaluated by obtaining the pulse life of fuse 900 with the pulse life test.

(1-2. Pulse Life Test)

Here, the pulse life of the fuse 900 according to comparison example 1 is described with reference to FIG. 3.

Figure 3:
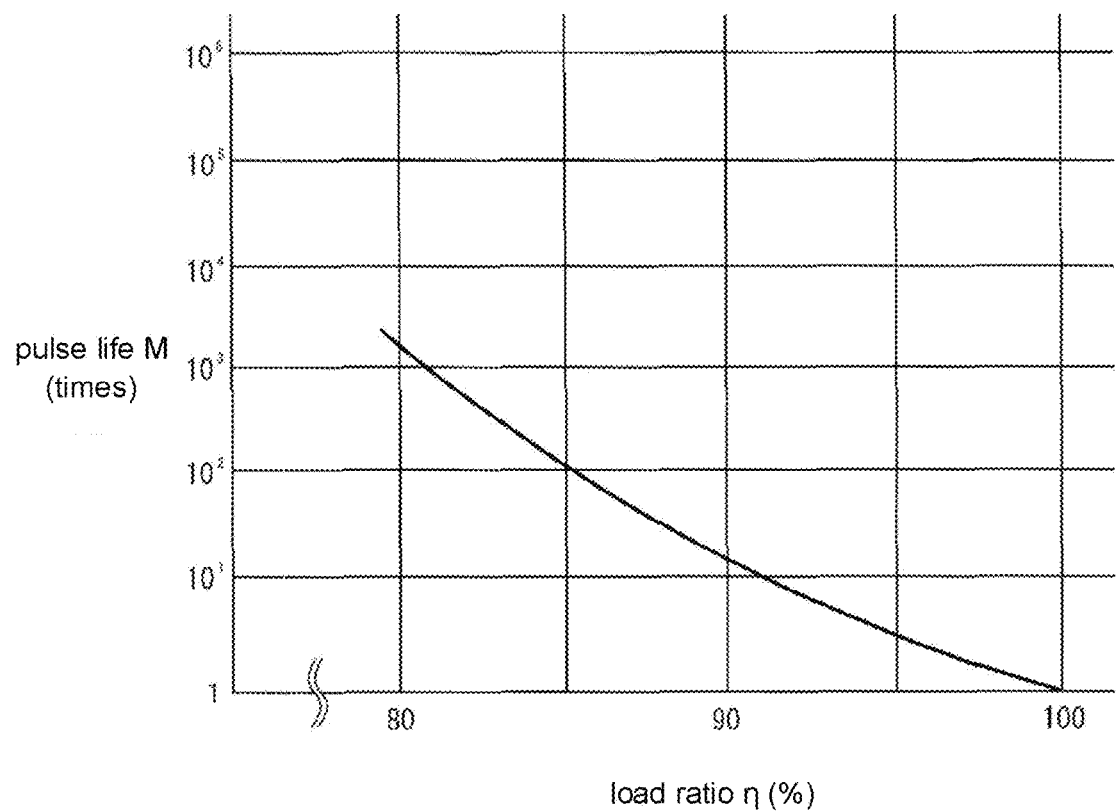
FIG. 3 is a graph showing a pulse life test result of the fuse 900 according to comparative example 1.

FIG. 3 is a graph showing a pulse life test result of the fuse 900 according to comparative example 1. The horizontal axis of the graph shows the current load ratio η (%) and the vertical axis shows the pulse life M (times). The pulse life M is a number of a pulse waveform that can be inputted to the fuse film 920 before the fuse film 920 is blown.

Figure 4:
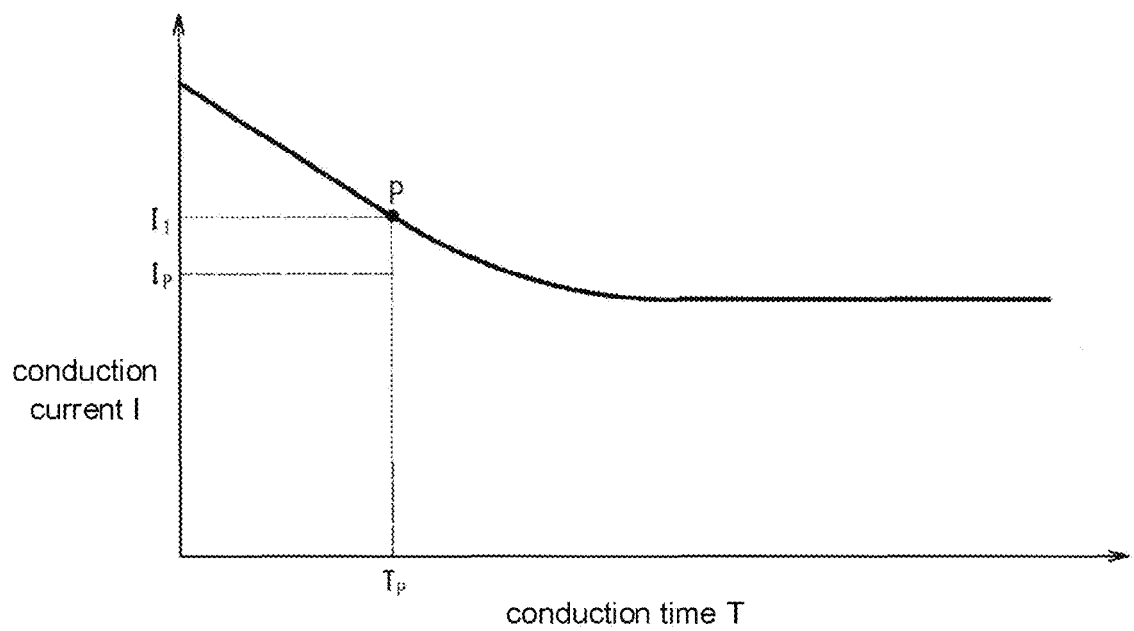
FIG. 4 is a graph showing a pre-arcing time-current characteristic curve of the fuse 900 according to comparative example 1.

The current load ratio η is set as below. FIG. 4 is a graph showing a pre-arcing time-current characteristic curve of the fuse 900 according to comparative example 1. The horizontal axis of the graph shows the conduction time T and the vertical line shows the conduction current I. As can be seen from FIG. 4, as the conduction time T increases, the pre-arcing time-current characteristic of the fuse 900 shows a tendency for the conduction current I to decrease.

Figure 5:
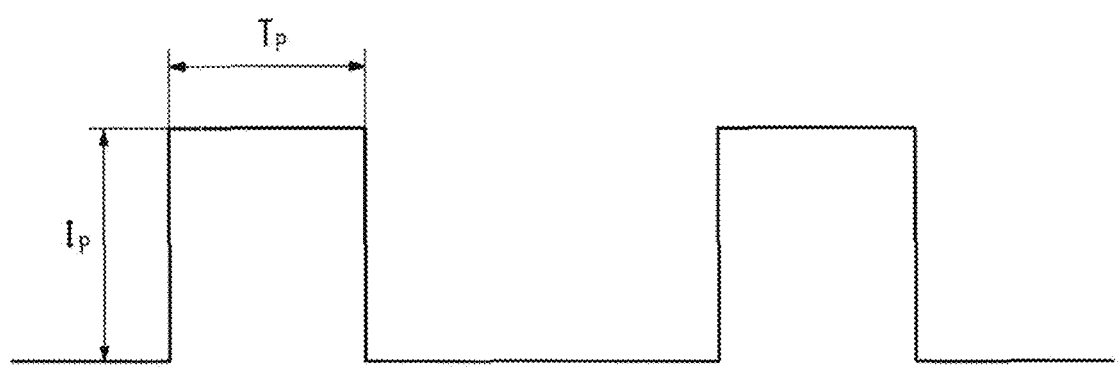
FIG. 5 is a diagram showing a pulse waveform inputted during a pulse life test.

FIG. 5 is a diagram showing the pulse waveform inputted during the pulse life test. The conduction time of the pulse waveform is $T_p$ and the conduction current of the pulse waveform is $I_p$. When the conduction time $T_p$ of the pulse waveform is set on the horizontal axis of the graph of FIG. 4, the fuse 900 is blown at a point P where the conduction current I is $I_1$. In such a case, the current load ratio η of the fuse 900 is $I_p/I_1$. Therefore, the current load ratio 11 is proportional to the magnitude of the conduction current $I_p$ of the pulse waveform.

As can be seen from the graph shown in FIG. 3, the pulse life of the fuse 900 according to comparative example 1 decreases as the current load ratio η increases. For example, when the current load ratio η is 100(%), the fuse film 920 is blown when the pulse waveform is inputted once, and when the current load ratio η is 90(%), the fuse film 920 is blown when the number of the inputted pulse waveform reaches about 20 times. Since the pulse waveform is repeatedly inputted to the fuse 900 normally, improvement of the pulse life of the fuse 900 is required.

(1-3. Heat Cycle Test)

The fuse 900 according to comparative example 1 receives a temperature change repeatedly over a long period depending on the surrounding environment and conditions of use. As a reliability test of such a fuse 900, a known heat cycle test is performed. By performing the heat cycle test, it is possible to evaluate, for example, damage, abnormal resistance change, and the like of the internal terminals 930 and the external terminals 950 of the fuse 900.

Here, as a heat cycle test, a temperature change from −40° C. to 125° C. was repeated twenty times for the fuse 900. As a result of the test, the resistance value between the external terminals 950 of the fuse 900 rose to about twice or more of the resistance value before the test. Accordingly, the reliability of the fuse 900 is insufficient, and an improvement is required.

(1-4. Peeling of Fuse Film)

There are cases where the fuse film 920 of the fuse 900 according to comparative example 1 is peeled from the support substrate 910 by repeating conducting states and non-conducting states, and the fuse 900 is blown. Hereinafter, a mechanism by which the fuse film 920 is peeled from the support substrate 910 is described.

The fuse film 920 generates heat when conducting. Further, the support substrate 910 that is bonded to the fuse film 920 receives the heat from the heated fuse film 920. As a result, the fuse film 920 and the support substrate 910 are thermally expanded due to the increase of temperature by Δθ at a bonding interface between the support substrate 910 and the fuse film 920.

Here, when the linear expansion coefficient of the fuse film 920 is $\alpha_1$ and the linear expansion coefficient of the support substrate 910 is $\alpha_2$, a misalignment force F of the following expression (1) is generated at the bonding interface.

$$F = K_1 \cdot K_2 \cdot (\alpha_1 - \alpha_2) \cdot \Delta\theta \tag{1}$$

It should be noted that $K_1$ is a constant determined from the shape and size of the fuse film 920 and the support substrate 910, and $K_2$ is a constant determined from the material and physical properties of the fuse film 920 and the support substrate 910.

Normally, the linear expansion coefficient $\alpha_2$ of the support substrate 910 made of an organic compound is larger than the linear expansion coefficient $\alpha_1$ of the fuse film 920 made of metal. Therefore, when the temperature of the fuse film 920 and the support substrate 910 is increased due to conduction, the misalignment force F generated at the bonding interface acts as a tensile force on the fuse film 920 and acts as a compressive force on the support substrate 910.

On the other hand, when the conduction is stopped, the temperature of the fuse film 920 and the support substrate 910 returns to the original temperature due to heat dissipation, and the misalignment force F generated at the bonding interface disappears. Therefore, when the conducting states and non-conducting states are repeated, generation and disappearance of the misalignment force F at the bonding interface are repeated, and as a result, the fuse film 920 is peeled from the support substrate 910.

The inventors of the present invention conducted a pulse life test to confirm a phenomenon of peeling of the fuse film 920. Hereinafter, the test result is described, and the details of the peeling phenomenon of the fuse film 920 are described.

Figure 6:
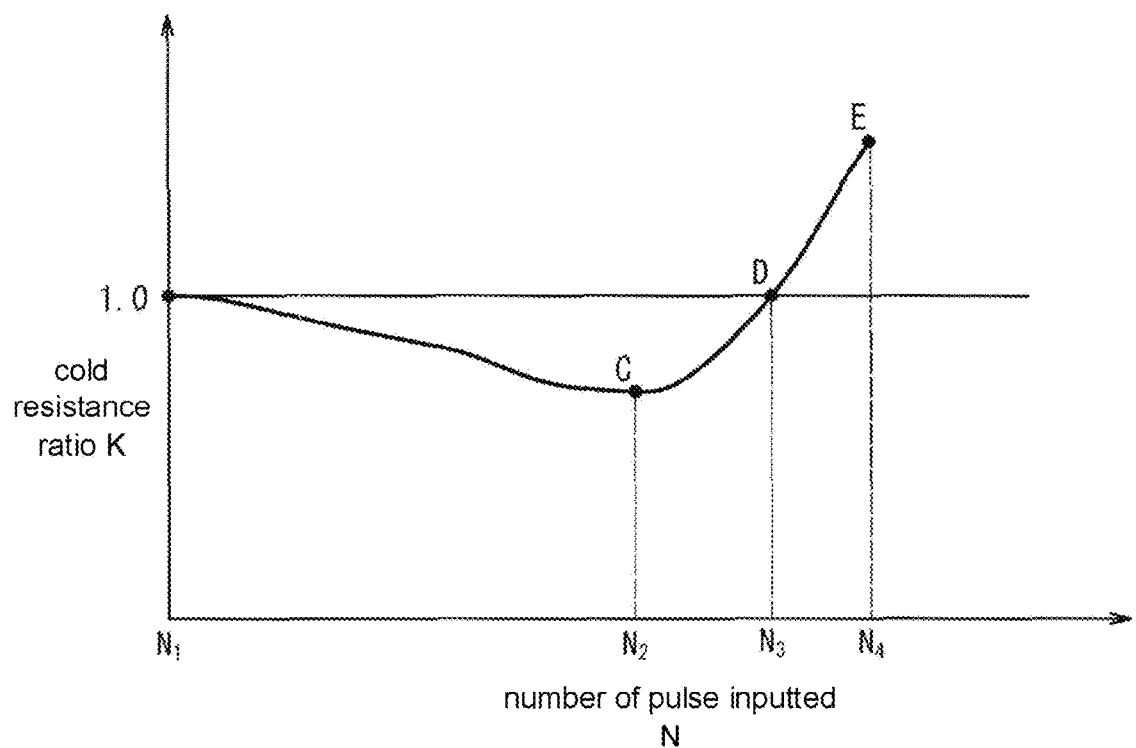
FIG. 6 is a graph showing the transition of the resistance value when a pulse life test was performed.

FIG. 6 is a graph showing the transition of the resistance value when the pulse life test was performed. The horizontal axis of the graph shows the number N of pulses inputted to the fuse 900, and the vertical axis shows the cold resistance ratio K of the fuse 900. Further, the horizontal axis has a logarithmic scale. The cold resistance ratio K is expressed by the following expression (2).

$$K = R/R_0 \tag{2}$$

Here, $R_0$ indicates the initial cold resistance of fuse 900, that is, the resistance when N=0, and R indicates the cold resistance when a predetermined pulse is inputted N times to the fuse 900. The cold resistance is the resistance value of the fuse 900 measured at room temperature in a state where conduction is stopped.

As can be seen from FIG. 6, the cold resistance ratio K decreases in the section where the input number N is from $N_1$ to $N_2$, and the cold resistance ratio K increases in the section where the input number N is from $N_2$ to $N_4$. On this occasion, the cold resistance ratio K was 1 at $N=N_3$ (D point), and the fuse film 920 was blown when $N=N_4$ (E point).

The following points were comprehended with the pulse life test. Specifically, when the cold resistance of the fuse 900 is increased, the heat generated by the fuse film 920 increases. Then, the temperature of the fuse film 920 increases, and the cold resistance further increases. The progress of this series of processes is accelerated as the number N of inputted pulses increases. In the pulse life test, the following points were confirmed by observing the fuse film 920. Specifically, it was found that, in the section where the number N of inputted pulses was from $N_3$ to $N_4$, the fuse film 920 was peeled from the bonding surface with the support substrate 910 and melted at the peeled portion.

When the temperature of the fuse film 920 rises, the misalignment force F increases because Δθ of the above-described expression (1) increases. Then, the misalignment force F becomes larger than the bonding strength between the fuse film 920 and the support substrate 910, and so the fuse film 920 is displaced from the support substrate 910 and is peeled from the support substrate 910. It should be noted that it was found that the bonding strength of the fuse film 920 with the support substrate 910 decreased as a result of repeating conducting states and non-conducting states, compared with the bonding strength at the time before the conduction was started. Therefore, an increase in the misalignment force F and a decrease in the bonding strength occur by repeating conducting states and non-conducting states, and the fuse film 920 is easily peeled from the support substrate 910.

It was found that the temperature of the fuse film 920 peeled from the support substrate 910 due to the conduction was remarkably higher than the temperature before the peeling. It should be noted that the reason for the large increase of temperature of the fuse film 920 after the peeling is that the transference of the heat, which is generated in the fuse film 920 due to the conduction, from the fuse film 920 to the support substrate 910 decreases when the fuse film 920 is peeled from the support substrate 910. The peeled fuse film 920 becomes easy to be blown since the heat generation and resistance also become easy to increase after that.

(1-5. Peeling of an Internal Terminal)

As described above, when a heat cycle test is conducted, the resistance value of the fuse 900 is greatly increased. As a result of investigating the fuse 900 after the test, it was found that the internal terminals 930 were peeled from the support substrate 910 at the time of the heat cycle test, which was a cause of an increase in the resistance value.

Specifically, at the time of the heat cycle test, a misalignment force F is generated at the respective bonding interfaces between the support substrate 910, the fuse film 920, and the internal terminals 930, which have different linear expansion coefficients, and the fuse film 920 and the internal terminals 930 are peeled from the support substrate 910. Then, when the internal terminals 930 are peeled from the support substrate 910, a misalignment force F is also generated at the bonding interface between the internal terminals 930 and the external terminals 950, and so the electrical resistance at the misaligned bonding interfaces rises, and as a result, the resistance value of the fuse 900 also increases. Therefore, in order to increase the reliability during the heat cycle test of the fuse 900, it is preferable to firmly bond the internal terminals 930 to the support substrate 910.

2. Configuration of Fuse

Figure 7:
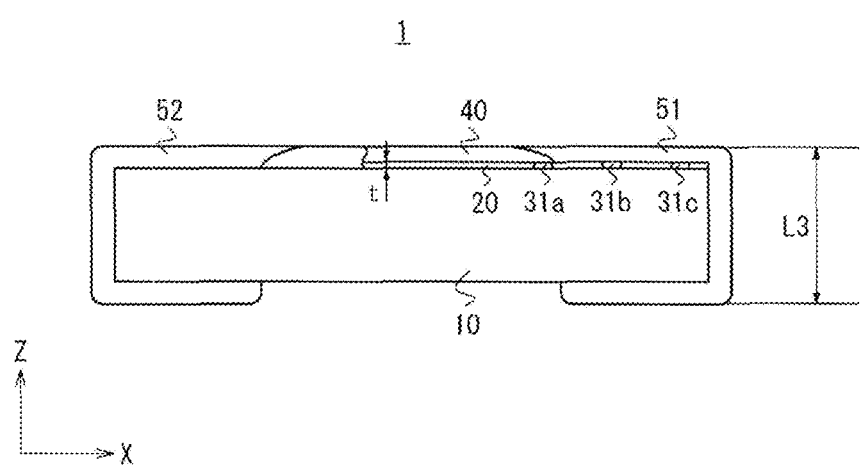
FIG. 7 is a schematic sectional view of a fuse 1 according to one exemplary embodiment of the present invention.
Figure 8:
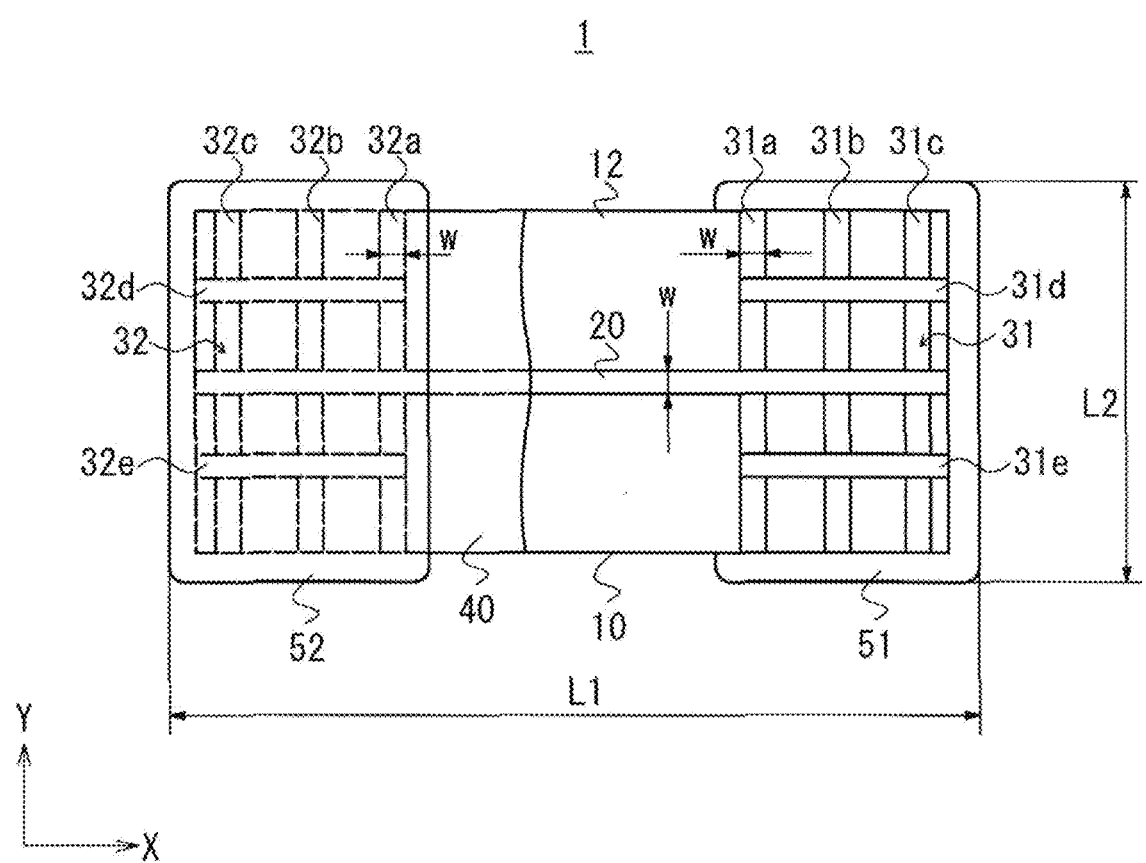
FIG. 8 is a schematic planar view of the fuse 1.

The configuration of the fuse 1 according to one exemplary embodiment of the present invention is described with reference to FIG. 7 and FIG. 8. FIG. 7 is a schematic sectional view of the fuse 1 according to one exemplary embodiment of the present invention. FIG. 8 is a schematic planar view of the fuse 1.

The fuse 1 is surface-mounted on a circuit board or the like of an electronic device, and is blown when abnormal current flows in the circuit. As shown in FIGS. 7 and 8, the fuse 1 includes a support substrate 10, a fuse film 20, internal terminal groups 31 and 32, an overcoat 40, and external terminals 51 and 52. The fuse 1 is electrically connected to the circuit board via the external terminals 51 and 52, and current is supplied from the circuit board to the fuse film 20 via the external terminals 51 and 52.

The length L1 of the fuse 1 in the longitudinal direction is about 1.6 (mm), and the length L2 in the width direction is about 0.8 (mm), and the thickness L3 is about 0.4 (mm). The lengths L1 and L2 are the same as those of the fuse 900 according to comparative example 1 shown in FIG. 2, but the thickness L3 is smaller than the thickness of the fuse 900. The weight of the fuse 1 is about 0.9 (mg), which is smaller than the weight of the fuse 900. As described above, the fuse 1 is a fuse whose thickness and weight are reduced.

The support substrate 10 is a substrate that supports the fuse film 20 and the internal terminal groups 31 and 32. The support substrate 10 is a substrate made of, for example, an organic compound, and the support substrate 10 here is a non-thermoplastic polyimide resin substrate. The thickness of the support substrate 10 is about 250 ($\mu$m).

The fuse film 20 is bonded to a principal surface 12 of the support substrate 10. The fuse film 20, which will be described later in detail, is formed on the principal surface 12 by irradiating the ink film containing metal nanoparticles with laser light. As the metal nanoparticles, for example, silver nanoparticles are used. The width w of the fuse film 20 is about 10 ($\mu$m), and the thickness t of the fuse film 20 is about 0.25 ($\mu$m).

The fuse film 20 has entering parts 22 (FIG. 9) that enter inside of the support substrate 10 from the bonding surface with the principal surface 12. The entering parts 22 are formed by fusing the metal nanoparticles, which are molten or sintered by being irradiated with the laser light at the time of forming the fuse film 20, with the principal surface 12 of the support substrate 10.

Figure 9:
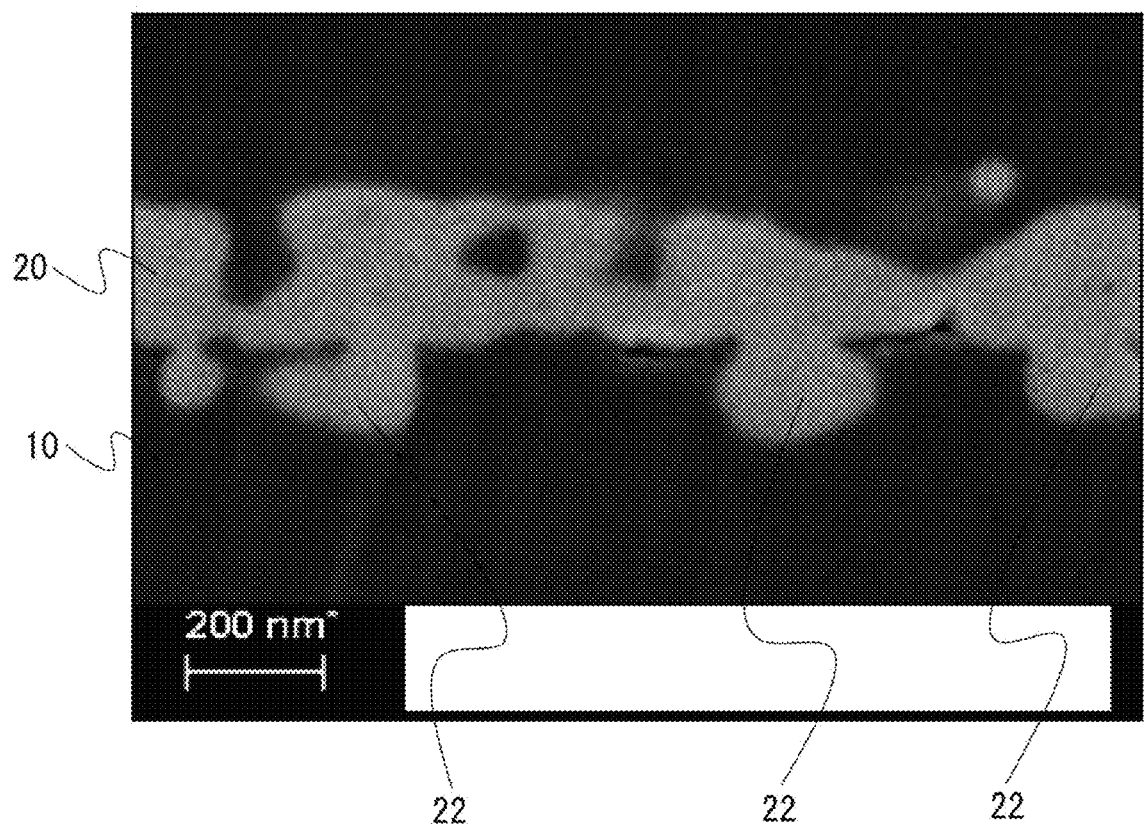
FIG. 9 is a captured image showing a bonding state between the fuse film 20 and the support substrate 10.

FIG. 9 is a captured image showing the bonding state between the fuse film 20 and the support substrate 10. The captured image shown in FIG. 9 is an image observed with known scanning electron microscopy (SEM). The SEM observation in the present exemplary embodiment was carried out using ULTRA55, which is an SEM manufactured by Carl Zeiss Corporation, and NSS312E (EDX), which is an energy dispersive X-ray spectrometer manufactured by Thermo Fisher Company.

In FIG. 9, the white portion is the fuse film 20 and the black portion under the white portion is the support substrate 10. As can be seen from FIG. 9, it can be confirmed that a plurality of entering parts 22 entering into the support substrate 10 from the fuse film 20 is dispersed. The shapes and sizes of the plurality of entering parts 22 are slightly different from each other.

The entering parts 22 are engaged with the inside of the support substrate 10. For example, the entering part 22 has a hook shape, and the hook-shaped portion is engaged with the inside of the support substrate 10. The shape of the entering part 22 is not limited to the hook shape, and the shape may be, for example, a spherical shape. Further, the width of the distal end side of the entering part 22 is larger than the width of the entering part 22 at the root part side. In this manner, it is easy to maintain the state where the entering parts 22 are engaged with the support substrate 10, and so the fuse film 20 is firmly bonded to the support substrate 10. As a result, it becomes difficult for the fuse film 20 to be deviated from the principal surface 12 of the support substrate 10, and the fuse film 20 is less likely to be peeled from the principal surface 12 of the support substrate 10.

The support substrate 10 also has entering parts 14 (FIG. 10) that enter the inside of the fuse film 20 from the principal surface 12. A plurality of entering parts 14 is dispersedly formed and is engaged with the inside of the fuse film 20. Since the entering parts 14 are formed in addition to the entering parts 22 in such a way, it is possible to further strengthen the bonding between the fuse film 20 and the support substrate 10.

Figure 10:
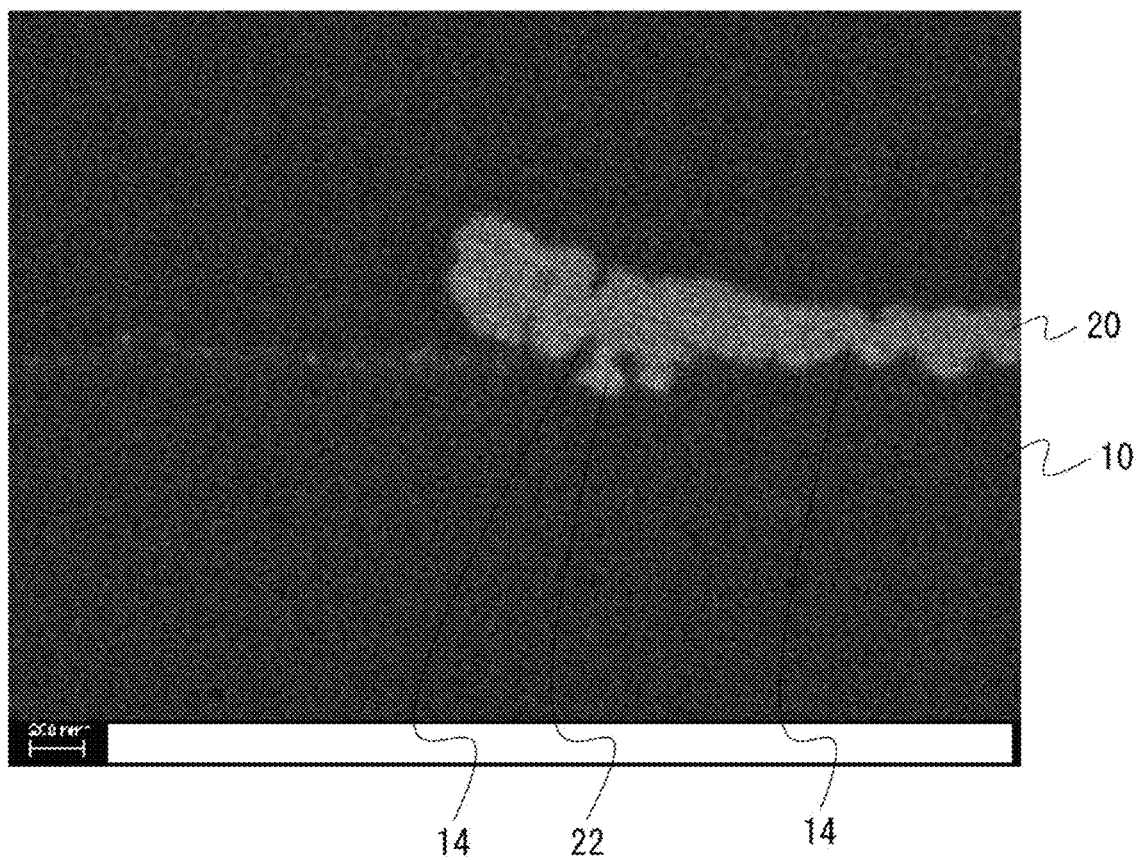
FIG. 10 is a captured image showing a bonding state between the fuse film 20 and the support substrate 10.

FIG. 10 is a captured image showing a bonding state between the fuse film 20 and the support substrate 10. FIG. 10 is also an image observed by SEM similarly to FIG. 9. It should be noted that the captured image shown in FIG. 10 shows a bonding state at the end portion in the longitudinal direction of the fuse film 920 unlike FIG. 9 that shows the bonding state on the position near the center in the longitudinal direction of the fuse film 920. As can be seen from FIG. 10, at the end portion in the longitudinal direction of the fuse film 920, the entering parts 14 that enter the inside of the fuse film 20 from the support substrate 10 in addition to the entering parts 22 are seen.

It should be noted that, in the fuse 900 according to comparative example 1 described above, an entering part is not formed in the fuse film 920 and the support substrate 910, and the bonding surface of the fuse film 920 and the principal surface of the support substrate 910 is smooth. Therefore, in the fuse 900, the fuse film 920 is easily peeled from the support substrate 910.

In the present exemplary embodiment, the entering part 22 of the fuse film 20 corresponds to a first entering part, and the entering part 14 of the support substrate 10 corresponds to a second entering part. In the above description, both the entering parts 22 and the entering parts 14 are formed, but it is not so limited. It is sufficient if at least any one of the entering part 22 and the entering part 14 is formed. Even in such a case, the fuse film 20 can be firmly bonded to the support substrate 10.

The internal terminal groups 31 and 32 are bonded to the principal surface 12 of the support substrate 10. As shown in FIG. 8, the internal terminal group 31 is a connection terminal connected to one end side in the longitudinal direction of the fuse film 20, and the internal terminal group 32 is a connection terminal connected to the other end side in the longitudinal direction of the fuse film 20. The internal terminal group 31 includes three internal terminals 31a, 31b, and 31c, which are spaced apart from each other in the longitudinal direction, and includes internal terminals 31d and 31e that connect the three internal terminals 31a, 31b, and 31c. Similarly, the internal terminal group 32 includes a plurality of internal terminals (internal terminals 32a, 32b, 32c, 32d, and 32e). Since the internal terminal groups 31 and 32 have the same configuration, the detailed configuration is described here taking the internal terminal group 31 as an example.

The internal terminals 31a to 31c of the internal terminal group 31 are each arranged along the intersecting direction intersecting with the longitudinal direction of the fuse film 20 (specifically, in the Y direction orthogonal to the X direction, which is the longitudinal direction, as shown in FIG. 8). Each of the internal terminals 31a to 31c has the same width w, which is the same as the width w of the fuse film 20. Further, the thickness of each of the internal terminals 31a to 31c is the same as the thickness t of the fuse film 20. The internal terminals 31d and 31e are provided on both sides of the fuse film 20 along the longitudinal direction of the fuse film 20. The width and the thickness of the internal terminals 31d and 31e are the same as the width and the thickness of the internal terminals 31a to 31c.

In the present exemplary embodiment, each of the internal terminal groups 31 and 32 has an entering part (corresponding to a third entering part) that enters the inside of the support substrate 10 from the bonding surface with the principal surface 12. The third entering part has a similar shape as the entering part 22 of the fuse film 20. Therefore, the internal terminal groups 31 and 32 are also firmly bonded to the support substrate 10.

The support substrate 10 has an entering part (corresponding to a fourth entering part) that enters the inside of the internal terminal groups 31 and 32 from the principal surface 12. The fourth entering part has a similar shape as the entering part 14. Since the fourth entering part is formed in addition to the third entering part, it becomes possible to further strengthen the bonding between the internal terminal groups 31 and 32 and the support substrate 10. It should be noted that, in the above description, both the third entering part and the fourth entering part are formed, but it is not so limited. At least any one of the third entering part and the fourth entering part may be formed.

The overcoat 40 is a coating part that coats the position near the center in the longitudinal direction of the fuse film 20. Further, the overcoat 40 also coats i) the internal terminal 31a located at the closest position to the center in the longitudinal direction of the internal terminal group 31 and ii) the internal terminal 32a located at the closest position to the center in the longitudinal direction of the internal terminal group 32. The overcoat 40 is made of, for example, an organic compound containing epoxy resin.

The external terminal 51 is electrically connected to a single internal terminal or a plurality of internal terminals in the internal terminal group 31 (the internal terminal 31b and the internal terminal 31c in FIG. 8) at one end in the longitudinal direction of the fuse film 20. The external terminal 52 is connected to a single internal terminal or a plurality of internal terminals in the internal terminal group 32 (the internal terminal 32b and the internal terminal 32c in FIG. 8) at another end in the longitudinal direction. The external terminals 51 and 52 are made of, for example, silver.

It should be noted that, in the above description, the support substrate 10 is a substrate made of an organic compound, but it is not so limited. For example, the support substrate 10 may be a substrate in which an organic compound and an inorganic compound are combined. In such a case, the proportion of the organic compound is preferably larger than the proportion of the inorganic compound.

(Pulse Life Test)

The pulse life of the fuse 1 of the above-described present exemplary embodiment is described in comparison with fuses according to comparative examples 2 and 3. Here, a pulse life test was conducted on the fuse 1 according to the present exemplary embodiment and fuses according to comparative examples 2 and 3 under the same conditions.

The fuse according to comparative example 2 is a fuse whose fuse film, which is made of silver, is formed on a principal surface of a polyimide support substrate by the vacuum evaporation method. The fuse according to comparative example 3 is a fuse whose fuse film is formed by drying and firing in a blower furnace after printing a dispersion liquid, in which silver nanoparticles that are about 15 (nm) are dispersed, on a principal surface of a polyimide support substrate. The thicknesses of the support substrates and the fuse films of comparative examples 2 and 3 are the same as the thickness (about 250 (μm)) of the support substrate 10 and the thickness (about 0.25 (μm)) of the fuse film 20 of the present exemplary embodiment respectively.

Figure 11:
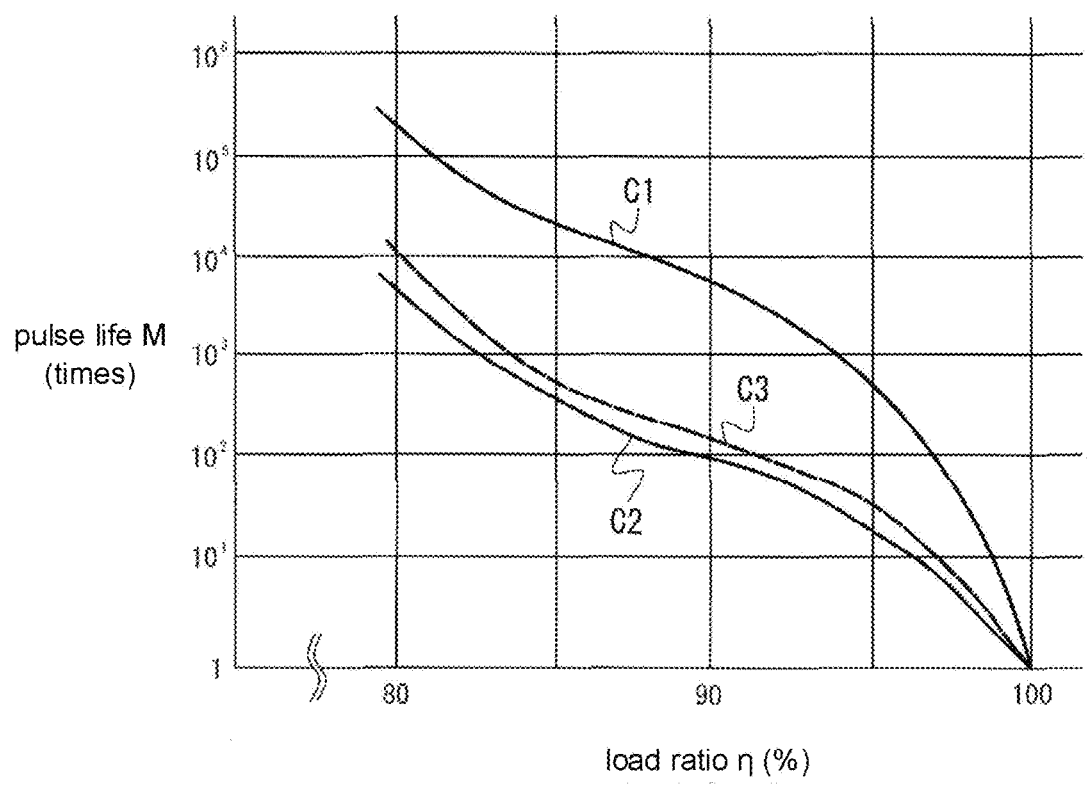
FIG. 11 is a graph showing pulse life test results of the fuse 1 according to the present exemplary embodiment and fuses according to comparative examples 2 and 3.

FIG. 11 is a graph showing pulse life test results of the fuse 1 according to the present exemplary embodiment and the fuses according to comparative examples 2 and 3. A curve C1 in FIG. 11 shows the pulse life of the fuse 1 according to the present exemplary embodiment, the curve C2 shows the pulse life of the fuse according to comparative example 2 in which the fuse film is formed by the vacuum evaporation method, and the curve C3 shows the pulse life of the fuse according to comparative example 3 in which the fuse film is formed by firing by a blower furnace. As can be seen from the graph, the pulse life of the fuse of comparative example 2 is about 100 times and the pulse life of the fuse of comparative example 3 is about 120 times when, for example, the current load factor is 90%. On the other hand, the pulse life of the fuse 1 of the present exemplary embodiment is about 4,500 times, and the pulse life is remarkably improved as compared with comparative examples 2 and 3.

Figure 12:
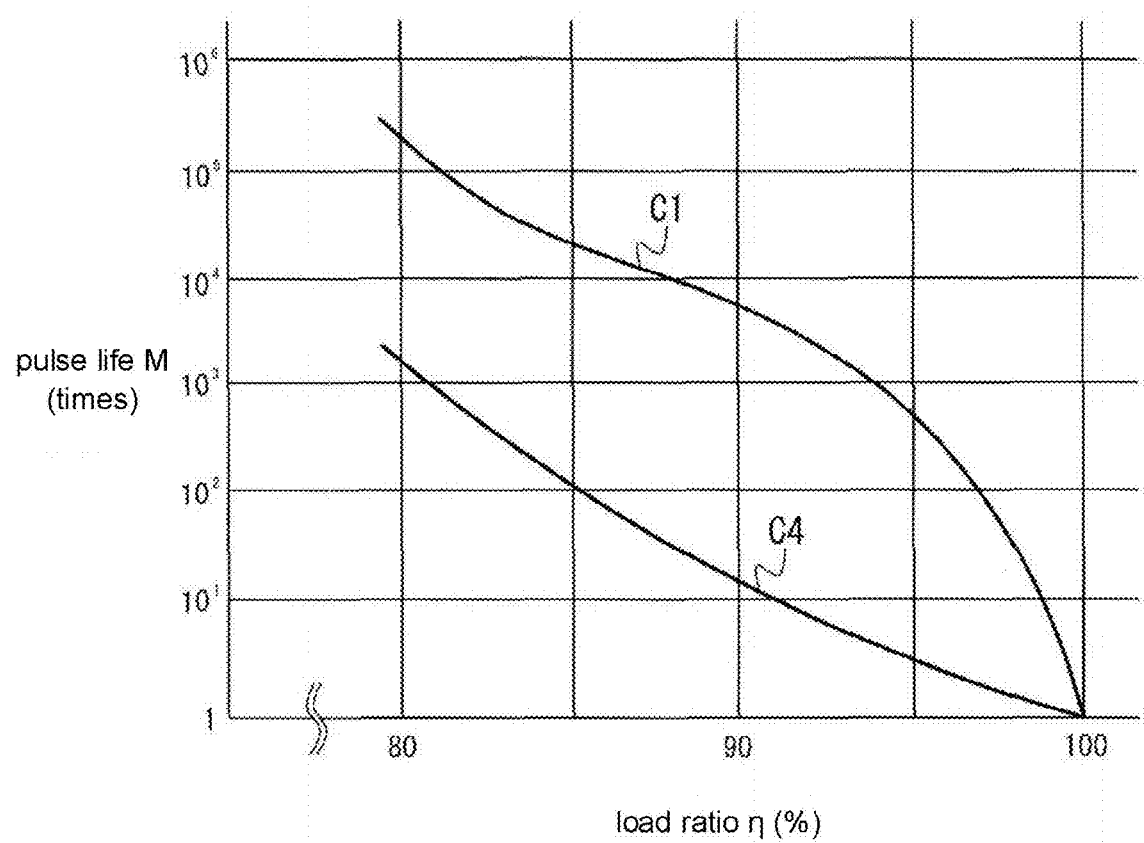
FIG. 12 is a graph showing pulse life test results of the fuse 1 according to the present exemplary embodiment and the fuse 900 according to comparative example 1.

Next, the pulse life of the fuse 1 according to the present exemplary embodiment and the pulse life of the fuse 900 according to comparative example 1, which was described with reference to FIG. 3, are described with reference to FIG. 12. FIG. 12 is a graph showing pulse life test results of the fuse 1 according to the present exemplary embodiment and the fuse 900 according to comparative example 1. The curve C1 in FIG. 12 shows the pulse life of the fuse 1 according to the present exemplary embodiment and the curve C4 shows the pulse life of the fuse 900 according to comparative example 1. As can be seen from the graph, the pulse life of the fuse 1 according to the exemplary embodiment is remarkably improved as compared with the pulse life of the fuse 900 according to comparative example 1.

(Peeling Test)

Next, the bonding strength of the fuse film 20 and the support substrate 10 of the fuse 1 of the present exemplary embodiment is described in comparison with the above-described fuses according to comparative examples 2 and 3. Here, in order to ascertain the bonding strength, the tape peeling test was carried out under the same conditions for the fuse 1 according to the present exemplary embodiment and the fuses according to comparative examples 2 and 3.

The tape peeling test was carried out in accordance with the 180 degree peeling test method of "Testing methods of pressure-sensitive adhesive tapes and sheets" specified in JIS Z0237. That is, first, a test piece, which was a cut portion of the fuse, was adhered and fixed on a glass substrate, and tape was attached to the surface of the fuse film of the test piece. Then, a glass substrate was fixed to a fixing jig and a test was conducted to peel one end of the tape 180 degrees using a load cell. It should be noted that, for a test piece having a strong bonding force, a peeling test was conducted after bonding the fuse film and the tape with an adhesive in advance.

The table 1 below shows the test results of the tape peeling test.

TABLE 1

|  | Present exemplary embodiment | Comparative example 2 | Comparative example 3 |
|---|---|---|---|
| Initial peeling strength (KN/m) | 3.1 | 0.37 | 1.12 |

It should be noted that the initial peeling strength means the peeling strength in an initial state before performing conduction through the fuse or bending the fuse.

As can be seen from the table 1, the peeling strengths of the fuses according to comparative examples 2 and 3 are 0.37 (KN/m) and 1.12 (KN/m), respectively. On the other hand, the peeling strength of the fuse 1 according to the present exemplary embodiment is 3.1 (KN/m), and the peeling strength is significantly larger than those of comparative examples 2 and 3. As a result, it was confirmed that the bonding strength of the fuse 1 of the present exemplary embodiment was larger than the bonding strengths of the fuses according to comparative examples 2 and 3. It should be noted that, from the results of the pulse life test and the peeling test described above, it was also confirmed that there was a correlation between the pulse life and the peeling strength shown in FIG. 11.

3. Fuse Production Method

Figure 13:
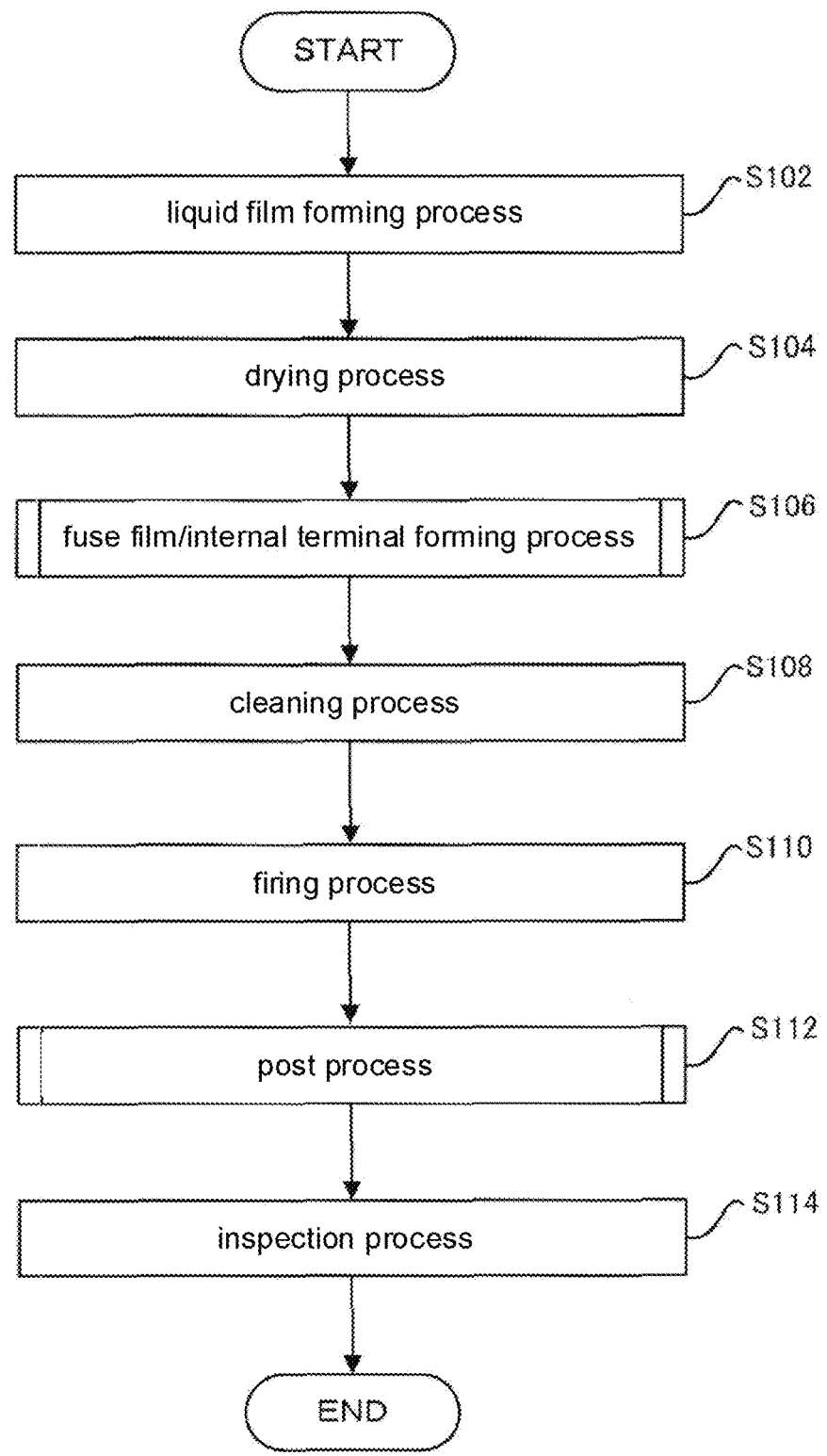
FIG. 13 is a flowchart showing a production process of the fuse 1.

An example of a method of producing the fuse 1 is described with reference to FIG. 13. FIG. 13 is a flowchart showing a production process of the fuse 1. As shown in FIG. 13, the production process of the fuse 1 includes a liquid film forming process, a drying process, a fuse film/internal terminal forming process, a cleaning process, a firing process, a post process, and an inspection process. Each process will be described below.

(Liquid Film Forming Process: S102)

In the liquid film forming process S102, an ink film 110 that is a liquid film of a dispersion liquid, in which metal nanoparticles are dispersed in a solvent, is formed on a surface 102 (see FIG. 14) that is a principal surface of a composite substrate 100. Specifically, ink, which contains metal nanoparticles, having a predetermined thickness is formed on the entire surface 102 of the composite substrate 100 by using a spin coater, which is not shown in figures.

As the metal nanoparticles, for example, silver nanoparticles are used. The average particle diameter of silver nanoparticles is 5 to 30 (nm), and it is about 15 (nm) herein. Further, the amount of silver nanoparticles contained in the ink (silver nanoink) is, for example, about 50 (wt %). It should be noted that the amount of the silver nanoparticles is not so limited, and may be, for example, 20 to 60 (wt %).

The solvent in the dispersion liquid is, for example, tetradecane which is a type of hydrocarbon. Tetradecane is a low-boiling solvent, but the dispersion liquid may contain other solvents with a high boiling point. Further, the dispersion liquid contains a dispersant for dispersing the metal nanoparticles in a solvent, and the dispersant is composed of an organic substance such as an aliphatic amine.

Figure 14:
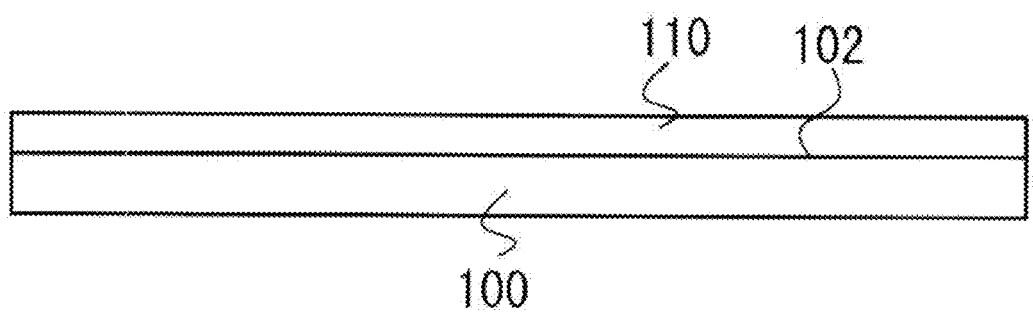
FIG. 14 is a schematic view showing an ink film 110 formed on a composite substrate 100.

FIG. 14 is a schematic view showing the ink film 110 formed on the composite substrate 100. In the exemplary embodiment, the plurality of ink films 110, corresponding to the plurality of support substrates 10 of the fuses 1, is formed on the composite substrate 100 and so a large amount of fuses 1 can be manufactured. Here, the composite substrate 100 is made of an organic compound (specifically, non-thermoplastic polyimide). The composite substrate 100 has a thickness of about 250 ($\mu$m) and a surface roughness Ra of about 0.05 ($\mu$m).

(Drying Process: S104)

In the drying process S104, the ink film 110 on the composite substrate 100 is dried. Specifically, the ink film 110 is dried at a temperature of, for example, about 70° C. for about one hour or less by using a heating blower furnace. As a result, a low boiling point solvent (for example, a portion of tetradecane) in the ink film 110 evaporates, and a dried ink film 110 (specifically, a nano silver ink film) having a uniform thickness is formed on the composite substrate 100. As a result, the surface 102 of the composite substrate 100 is coated with the dried ink film 110 and is isolated from the atmosphere.

(Fuse Film/Internal Terminal Forming Process: S106)

In the fuse film/internal terminal forming process, a laser irradiation apparatus radiates laser light onto the ink film 110 on the composite substrate 100 to form a fuse film and internal terminals. Before describing the fuse film/internal terminal forming process, the configuration of the laser irradiation apparatus is described below.

(Configuration of Laser Irradiation Apparatus 200)

Figure 15:
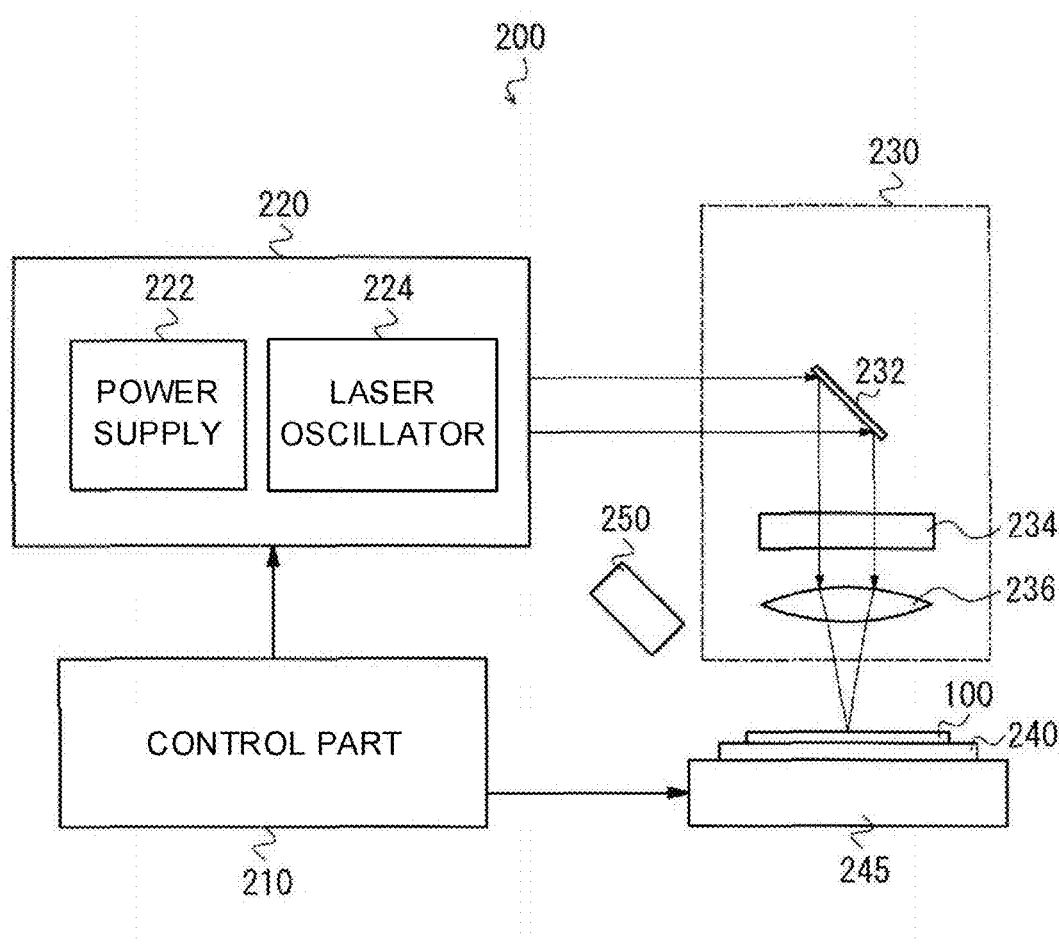
FIG. 15 is a schematic diagram showing an example of a configuration of a laser irradiation apparatus 200.

FIG. 15 is a schematic diagram showing an example of a configuration of a laser irradiation apparatus 200. The laser irradiation apparatus 200 includes a control part 210, a laser output part 220, an optical part 230, a movable table 240, a table driving device 245, and a detection part 250.

The control part 210 controls the entire operation of the laser irradiation apparatus 200. For example, when the control part receives the CAD information on the shapes and positions of the fuse film and the internal terminal from the personal computer, the control part 210 radiates the laser light onto the ink film on the composite substrate 100 at a relative scanning speed by controlling the movement of the movable table 240 and the radiation of the laser light. Further, the control part 210 adjusts the scanning speed and the radiation intensity of the laser light.

The laser output part 220 includes a power supply 222 and a laser oscillator 224. The laser oscillator 224 continuously oscillates the laser light in accordance with the output from the power supply 222. Here, the spot diameter $\varphi$ (L) of the laser light is, for example, 10 ($\mu$m). Further, the laser light is, for example, Nd-YAG laser light having a wavelength of 1064 (nm) and an average radiation intensity from $3.0 \times 10^4$ to $5.0 \times 10^5$ (W/cm$^2$).

The optical part 230 includes a mirror 232, an optical filter 234, and a lens 236. The mirror 232 adjusts the radiation direction of the laser light. The optical filter 234 has a function of attenuating the light amount of the laser light. The optical filter 234 is, for example, a Neutral Density (ND) filter. The lens 236 collects the laser light attenuated by the optical filter 234.

By using the above-described optical filter 234, the selection range of the radiation condition (for example, the radiation intensity) of the laser light is expanded. For example, in the case where the average radiation intensity is controlled in a range from $3.0 \times 10^4$ to $5.0 \times 10^5$ (W/cm$^2$), oscillation of the laser light may become unstable, which hinders the firing of the ink film, when the output of the power supply 222 is set to a predetermined value or less. Because attenuation of the light amount of the laser light is effective to cope with such a problem, the optical filter 234 is used. Further, the optical filter 234 is detachably mounted. Thus, an appropriate optical filter 234 can be selected and mounted from among optical filters having different characteristics.

The movable table 240 is movable in the X-Y directions. The movable table 240 includes a substrate sucking part, and sucks and holds the composite substrate 100. The table driving device 245 independently moves the movable table 240 in the X direction and the Y direction. The detection part 250 is, for example, a CCD camera, and detects the position of the composite substrate 100 and the radiation state of the laser light on the composite substrate 100.

The configuration of the laser irradiation apparatus 200 has been described above. Next, details of the fuse film/inner terminal forming process S106 using the laser irradiation apparatus 200 are described with reference to FIGS. 16 and 17.

Figure 16:
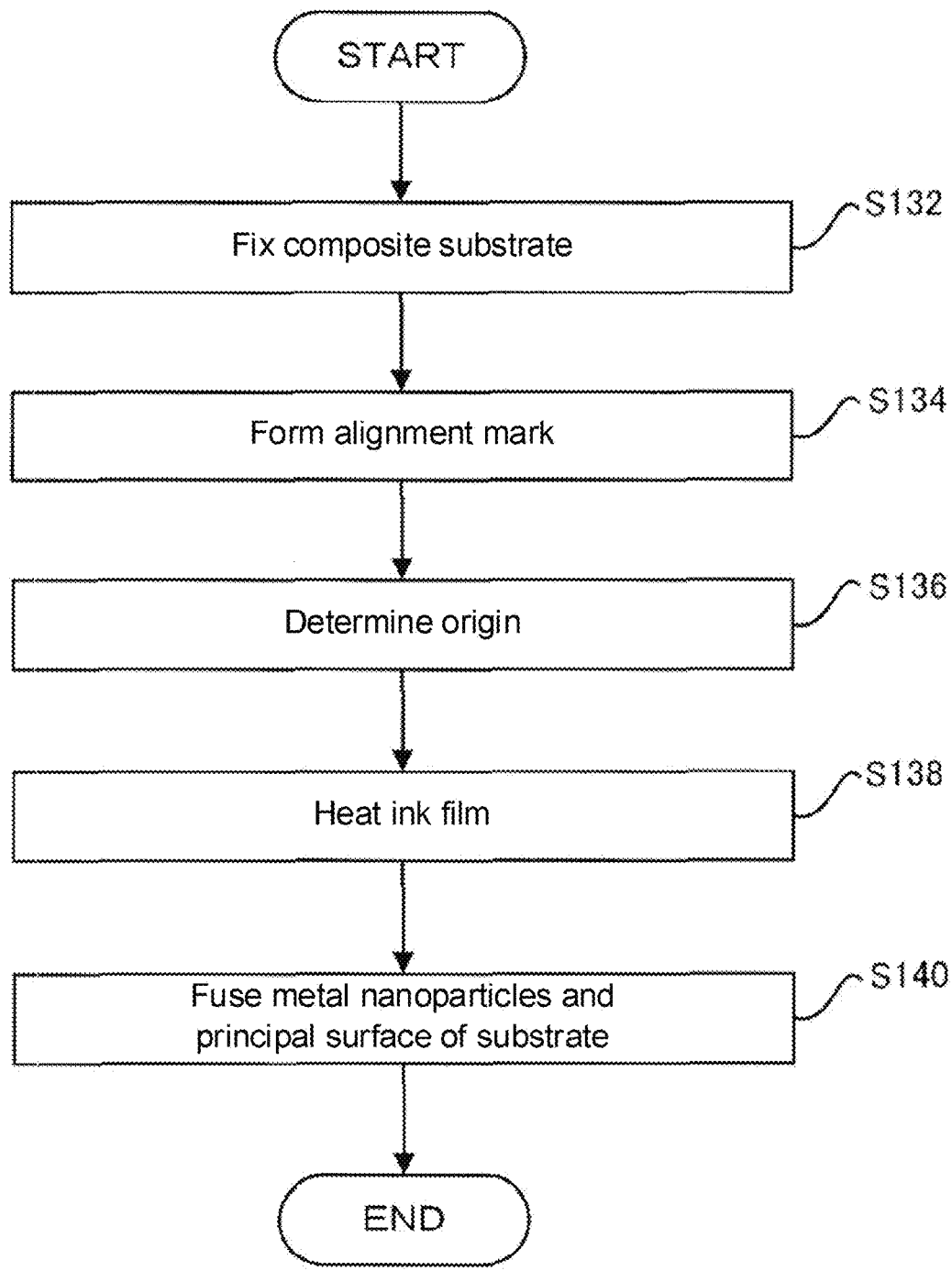
FIG. 16 is a flowchart showing details of a fuse film/internal terminal forming process.
Figure 17:
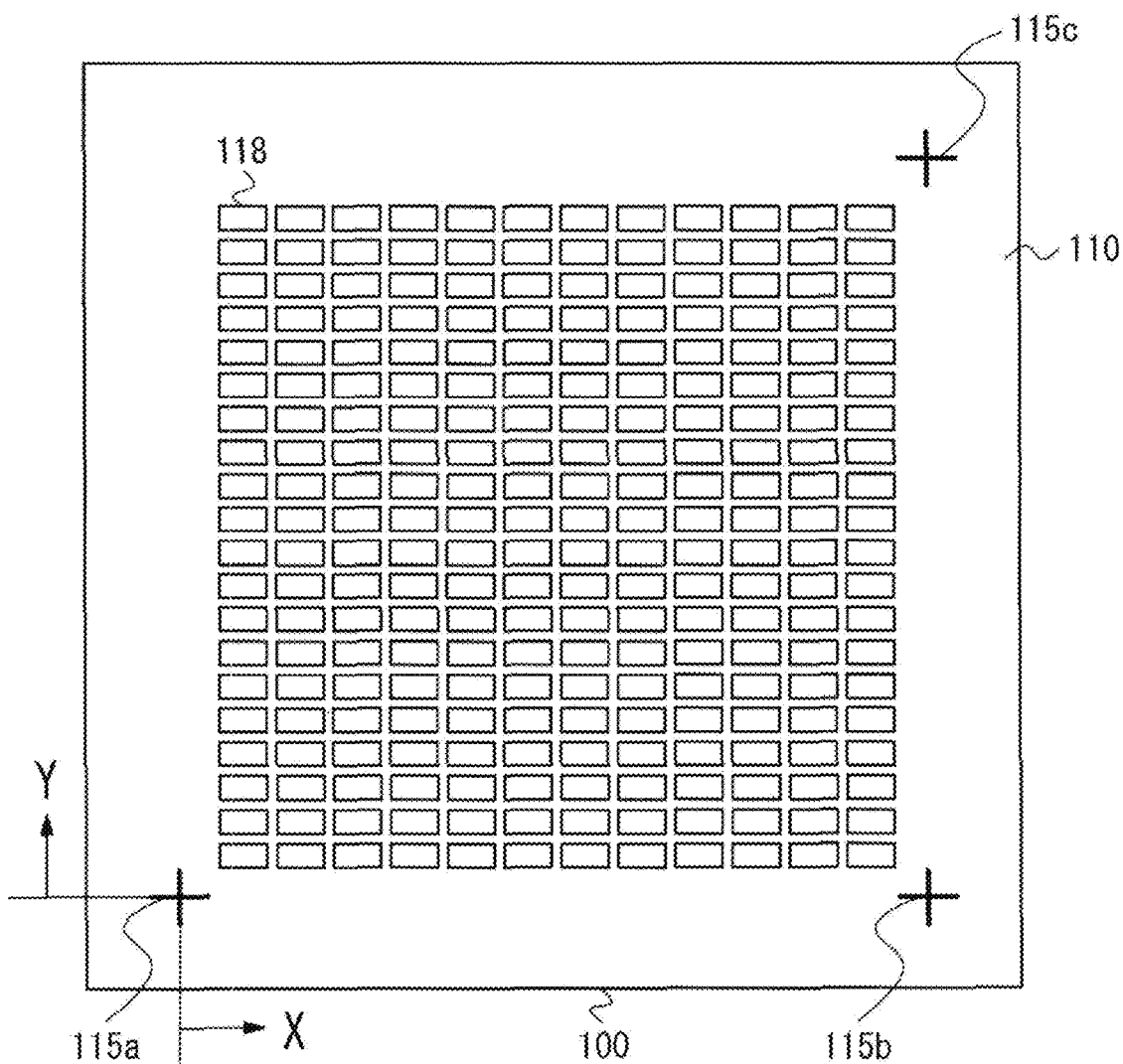
FIG. 17 is a diagram showing the composite substrate 100 after formation of a fuse film/internal terminal.

FIG. 16 is a flowchart showing details of a fuse film/internal terminal forming process. FIG. 17 is a diagram showing the composite substrate 100 after formation of a fuse film/internal terminal. It should be noted that FIG. 17 schematically shows a sub-assembly 118 including a fuse film and an internal terminal corresponding to one fuse after forming the fuse film/internal terminal.

In the fuse film forming process, first, the composite substrate 100 having the ink film 110 formed on the surface 102 is sucked and fixed to the movable table 240 (step S132). Next, the laser light irradiates corners of the ink film 110 on the composite substrate 100 to form alignment marks 115a, 115b, and 115c as shown in FIG. 17 (step S134). The shapes of the formed alignment marks 115a to 115c are, for example, substantially cross shape. Here, the alignment marks 115a to 115c are position adjustment marks for adjusting the forming position for forming the plurality of fuse films and internal terminals on the composite substrate 100.

Next, the three alignment marks 115a to 115c are read by the detection part 250, and the X direction and the Y direction of the composite substrate 100 are determined with reference to the position of the read alignment mark and the origin is also determined at the same time (step S136). Here, the alignment mark 115a is the origin.

(Heating Process of Ink Film 110: S138)

Next, the laser light irradiates the surface of the dried ink film 110 to heat the ink film 110 (step S138). On this occasion, the portion that is irradiated with the laser light is specified on the basis of the position of the alignment mark 115a (origin). That is, the control part 210 receives the CAD information relating to i) the shapes of the fuse film and the internal terminal and ii) the positions of the fuse film and the internal terminal based on the position of the alignment mark 115a from the personal computer, and controls the movement of the movable table 240 and the radiation of the laser light. For example, the control part 210 radiates the laser light substantially perpendicularly to the surface of the ink film 110 at a scanning speed of about 3 to 90 (mm/sec).

In the present exemplary embodiment, the ink film 110 is heated so as to vaporize the high boiling point solvent and dispersant included in the ink film 110. Specifically, the ink film 110, which is irradiated by the laser light, is mainly composed of a solvent having a high boiling point, a dispersant, and silver nanoparticles. Here, since the silver nanoparticles have an average particle diameter of about 15 (nm) and have an absorption characteristic of absorbing the laser light having a wavelength of 1064 (nm), they absorb light (plasmon absorption) to generate heat. As a result, when the temperature of the silver nanoparticles rises to, for example, 500° C., (a portion of) the high-boiling solvent and the dispersant are vaporized. For example, solvents and dispersants evaporate or gasify (oxidize). Then, as the dispersant is vaporized, the dispersant and the silver nanoparticles separate from each other.

The silver nanoparticles that separated from the dispersant are in a bare state and the activity of the surface of the silver nanoparticles is enhanced. Then, the silver nanoparticles melt, and some of the silver nanoparticles are sintered to form silver particles. The molten silver nanoparticles or the sintered silver particles transfer heat to the surface 102 of the contacting composite substrate 100, which is a non-thermoplastic polyimide substrate, to heat the surface 102. The surface 102 is heated to a temperature close to about 500° C. Further, the surface 102 is substantially isolated from the atmosphere by silver nanoparticles (or silver particles) and a dispersant located on the surface 102.

The heated surface 102 exceeds (specifically, at a temperature lower than 600° C.) the glass transition temperature (about 420° C.) of the composite substrate 100 and is softened or melted in a state substantially isolated from the atmosphere.

Here, the reason for causing the surface 102 to be substantially isolated from the atmosphere is to prevent occurrence of an undesirable phenomenon such as easy carbonization of the surface 102 when the surface 102 is in contact with the atmosphere. Further, the temperature of the heated surface 102 is preferably controlled to be higher than the glass transition temperature (about 420° C.) and not more than 600° C. When the temperature of the surface 102 reaches a temperature greatly exceeding 500° C. (for example, 600° C. to 700° C.), carbonization of the surface 102 proceeds, and so the surface 102 cannot be softened or melted sufficiently. Similarly, when the temperature of the surface 102 does not reach the glass transition temperature, the surface 102 also cannot be sufficiently softened or melted.

In the present exemplary embodiment, the laser light irradiates the ink film 110 only once to heat the ink film 110. Therefore, it is preferable that the radiation intensity of the laser light is large. But if the radiation intensity is excessively large, the ink film 110 is blown away (so-called ablation) when the ink film 110 on the surface 102 is irradiated with the laser light, and the surface 102 has a possibility of being exposed to the atmosphere and being carbonized.

On the other hand, when the radiation intensity of the laser light is set lower and the laser light is radiated a plurality of times, the following problems occur. The light absorption reaction of silver nanoparticles in the ink film 110 occurs in the surface layer of the ink film 110. Therefore, an absorption exothermic reaction occurs in the surface layer of the ink film 110 with the first irradiation by the laser light, and so carbonization and hardening of the dispersant in the surface layer and sintering of the silver nanoparticles occur. Thereafter, when the second irradiation is performed, the carbonized or hardened dispersant or the like becomes an obstacle and the laser light does not sufficiently reach the unsintered silver nanoparticles existing in the lower portion of the surface layer, and so the surface 102 of the composite substrate 100 cannot be heated sufficiently. In addition, since gas and the like generated in the lower portion of the surface layer are blocked by the surface layer and cannot be sufficiently discharged to the atmosphere, it becomes difficult to manage physical property values such as resistivity of the ink film 110.

From the above-described result of examination on the radiation intensity of the laser light, the laser light is Nd-YAG laser light having a wavelength of 1064 (nm) and an average radiation intensity from $3.0 \times 10^4$ to $5.0 \times 10^5$ (W/cm$^2$) as described above. But it is not so limited, and the laser light may be Nd-YAG laser light having a wavelength of 532 (nm) and an average radiation intensity of $2.0 \times 10^3$ to $7.0 \times 10^4$ (W/cm$^2$). Because silver nanoink has a higher absorptance of the harmonic laser light having a wavelength of 532 (nm) than of the laser light having a wavelength of 1064 (nm), the average radiation intensity of the laser light having a wavelength of 532 (nm) is set lower.

In order to appropriately soften or melt the surface 102 by irradiating the ink film 110 with the laser light, it is necessary to control the scanning speed of the laser light in addition to the radiation intensity of the laser light. For example, when the scanning speed of the laser light exceeds 90 (mm/s), the surface 102 could not be softened or melted sufficiently. Therefore, in the present exemplary embodiment, the scanning speed of the laser light is set to 3 to 90 (mm/s). It should be noted that, regarding the setting of the radiation intensity and the scanning speed of the laser light, it is preferable to consider the thickness of the ink film 110 and the spot diameter of the laser light particularly.

Here, the present exemplary embodiment is described by applying the knowledge of thermodynamics. In the system in which the laser light irradiates the surface of the ink film 110 to heat the surface, the average distance L(L) in the thickness direction of the ink film 110 that the heat reaches is expressed by the following expression (3).

$$L(L)=K_1 \cdot (\kappa_i)^\alpha \cdot \tau^\beta \quad (3)$$

It should be noted that $\kappa_i$ is the average thermal diffusivity in the thickness direction of the ink film 110, $\tau$ is the radiation time of the typical laser light, $\alpha$ and $\beta$ are predetermined numbers which are $\alpha>0$, $\beta>0$, and $K_1$ is a proportional constant.

Further, when the spot diameter of the laser light to be radiated is $\varphi(L)$ and the relative scanning speed of the laser light is V(L), the representative radiation time $\tau$ of the laser light according to the present exemplary embodiment for irradiating the ink film 110 with the laser light in the continuous oscillation mode is expressed by the following expression (4).

$$\tau=K_2 \cdot \varphi(L)/V(L) \quad (4)$$

It should be noted that $K_2$ is a correction coefficient related to the shape and the like of the laser light.

When expression (4) is substituted in expression (3), the following expression (5) is obtained.

$$L(L)=K_1 \cdot (\kappa_i)^\alpha \cdot (K_2 \cdot \varphi(L)/V(L))^\beta \quad (5)$$

According to the expression (5), the distance L(L) that heat reaches is determined by each factor of $\kappa_i$, $\varphi(L)$, and V(L), which means that there is a combination of each factor value. That is, when the thermal diffusivity $\kappa_i$ and the spot diameter $\varphi(L)$ are fixed values, the distance L(L) is considered to be determined by the scanning speed V(L). In the present exemplary embodiment, if it is considered that the distance L(L) represents the distance from the surface of the ink film 110 to the surface 102 of the composite substrate 100 (thickness for heating the ink film 110), when the thickness of the ink film 110 and the average thermal diffusivity $\kappa_i$ are fixed values, it can be considered that the scanning speed V(L) needs to be selected according to the spot diameter $\varphi(L)$. Further, as a result of observing the change in the state of softening or melting the surface 102 of the composite substrate 100 depending on the thickness t(L) of the ink film 110 by changing the spot diameter $\varphi(L)$ and the scanning speed V(L), it was found that the distance L(L) has a strong correlation with the thickness t(L). That is, it can be considered that the average distance L(L) that the heat reaches in the thickness direction of the ink film 110 is indicative of the thickness t(L).

It should be noted that, when the thickness of the ink film 110 was larger than about 3.0 (μm), it is necessary to heat the ink film 110 with extremely low scanning speed of the laser light, and so it was judged that it was not practical in the present exemplary embodiment. On the other hand, when the thickness was smaller than about 0.1 (μm), the surface 102 of the composite substrate 100 could not be stably softened or melted even when the scanning speed of the laser light was increased.

In the present exemplary embodiment, in order to stably soften or melt the surface 102 while preventing the carbonization and excessive deformation of the surface 102 by heating the surface 102 of the composite substrate 100 in a predetermined temperature range, the heating conditions of the ink film 110, the metal nanoparticles, the solvent, the dispersant, and the physical properties, shape, size, and the like of composite substrate are considered.

(Fusion Process of Metal Nanoparticle and Surface 102: S140)

Figure 18:
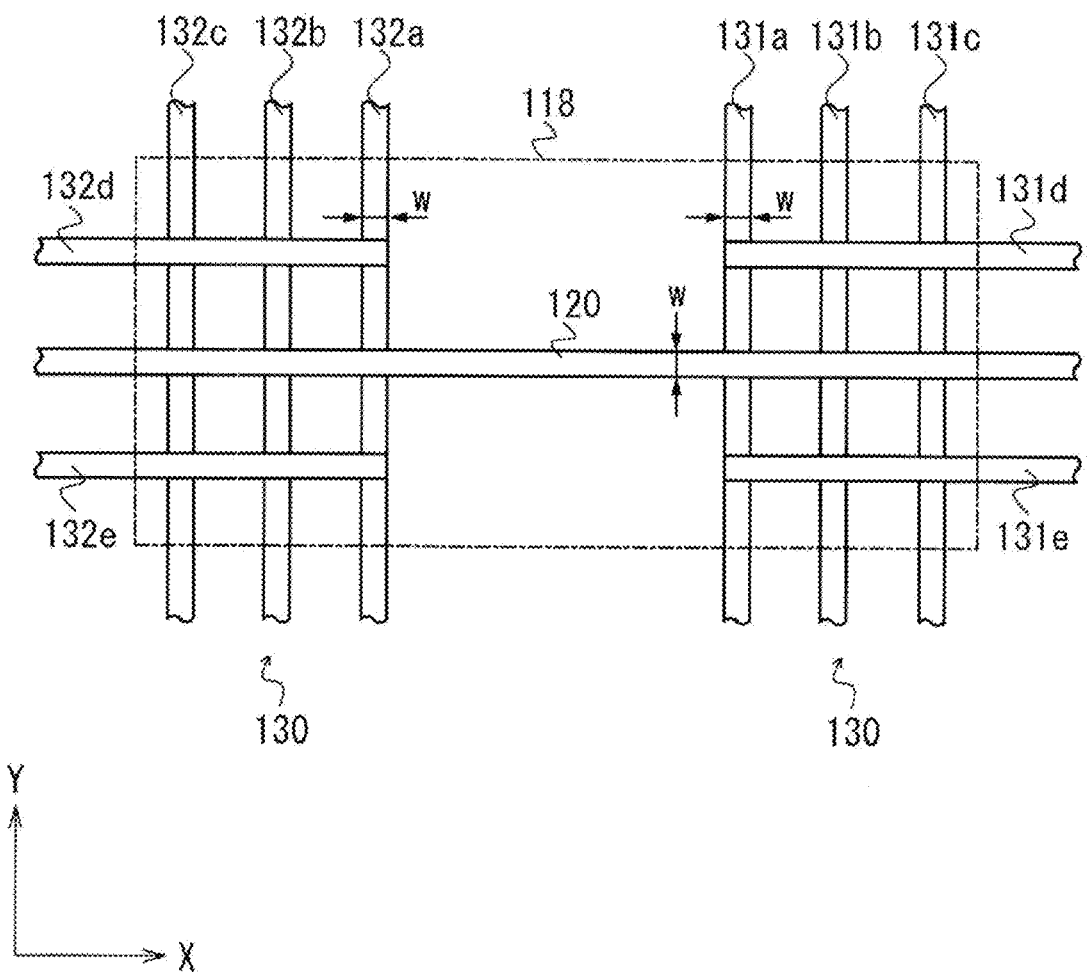
FIG. 18 is a diagram showing a formation state of a fuse film 120 and internal terminal groups 130.

After irradiating the ink film 110 on the surface 102 with the laser light in step S138, the melted or sintered metal nanoparticles in the ink film 110 and the softened or melted surface 102 are fused to each other by, for example, leaving them for a predetermined time (Step S140). As a result, as shown in FIG. 18, the fuse film 120 and the internal terminal groups 130 are formed on the surface 102. That is, the portions of the ink film 110 heated by being irradiated with the laser light become the fuse film 120 and the internal terminal groups 130.

Here, the fusion state of the metal nanoparticles and the surface 102 is described. The melted or sintered metal nanoparticles in the ink film 110 come into contact with the softened or melted surface 102 to form a mutually fused bonding interface. That is, the surface tensions of the metal nanoparticles and the surface 102 interact with each other, and a bonding interface where the metal nanoparticles and the surface 102 are wetted with each other is freely formed. By forming a bonding interface, the fuse film 120 and the internal terminal groups 130 are formed on the surface 102.

Specifically, the metal nanoparticles are deformed to, for example, a spherical surface shape due to the surface tension, and the surface 102 having a surface tension larger than that of the metal nanoparticles forms a bonding interface by being deformed to envelop the spherically deformed metal nanoparticles due to the surface tension.

The metal nanoparticles constituting the fuse film 120 and the internal terminal groups 130 form an entering part (specifically, the entering part 22 shown in FIG. 9) extending into the inside of the composite substrate 100 at the bonding interface and entering into the inside of the composite substrate 100. The entering part has, for example, a hook shape and is engaged with the inside of the composite substrate 100. The width of the distal end of the hook-shaped entering part is larger than the width of the root part side of the entering part. By forming such an entering part, it is possible to firmly bond the fuse film 120 to the composite substrate 100.

FIG. 18 is a diagram showing a formation state of the fuse film 120 and internal terminal groups 130. The fuse film 120 and the internal terminal groups 130 constituting one sub-assembly 118 extend linearly, and they are connected to the fuse film 120 and the internal terminal groups 130 of the other sub-assembly 118. A portion of the fuse film 120 and the internal terminal groups 130 protruding from the sub-assembly 118 is cut off when the sub-assembly 118 is cut out from the composite substrate 100. It should be noted that the fuse film 120 and the internal terminal groups 130 may be formed in a manner that the fuse film 120 and the internal terminal groups 130 do not protrude from the sub-assembly 118, unlike in FIG. 18.

As can be seen from FIG. 18, the fuse film 120 has a linear shape extending in the X direction. The width w of the fuse film 120 is, for example, 10 (μm) which is approximately the same size as the spot diameter φ(L) of the laser light. The thickness of the fuse film 120 is, for example, 0.25 (μm). The internal terminal groups 130 are respectively connected to the fuse film 120 at both ends in the longitudinal direction of the sub-assembly 118 of the fuse film 120. Each of the two internal terminal groups 130 includes three internal terminals 131a to 131c and internal terminals 132a to 132c having the same shape. Further, the internal terminal groups 130 include internal terminals 131d and 131e for connecting the internal terminals 131a to 131c, which are spaced apart from each other, and internal terminals 132d and 132e for connecting the internal terminals 132a to 132c.

Each of the internal terminals 131a to 131e and 132a to 132e of the internal terminal groups 130 is formed under the same radiation conditions of the laser light as the time when the fuse film 120 is formed. Therefore, the width w of each internal terminal (the internal terminal 131a is described as an example) of the internal terminal groups 130 has the same size as the width w of the fuse film 120. Further, the thickness of the internal terminal 131a is also the same as the thickness of the fuse film 120. Then, the internal terminal groups 130 are firmly bonded to the composite substrate 100 by the entering part (specifically, the third entering part and the fourth entering part described above) like the fuse film 120. It should be noted that the width and the thickness of each internal terminal of the internal terminal groups 130 may be different from the width and the thickness of the fuse film 120. In addition, the radiation condition of the laser light at the time of forming the internal terminal groups 130 may be different from the radiation condition at the time of forming the fuse film 120.

In the present exemplary embodiment, because the fuse film 120 and the internal terminal groups 130 are formed in one process, the positional accuracy of the internal terminal groups 130 with respect to the fuse film 120 can be improved as compared with the case where the fuse film 120 and the internal terminal groups 130 are formed in separate processes. Further, the process at the time of producing is simplified, and low cost can be easily realized.

In the present exemplary embodiment, the linear fuse film 120 and the internal terminal groups 130 having the width corresponding to the spot diameter of the laser light is formed by scanning the ink film 110 once with the laser light. Furthermore, the fuse film 120 and the internal terminal groups 130 having the length corresponding to the scanning width of the laser light are formed. As a result, a large amount of the fuse films 120 and the internal terminal groups 130 can be formed in a short time.

The thickness (the second thickness) of the ink film 110 after irradiation of the laser light is smaller than the thickness (the first thickness) of the ink film 110 before irradiation with the laser light. Because the correspondence between the first thickness and the second thickness has been previously analyzed by experiments or the like, in the process of forming the ink film 110 in step S102 described above, the ink film 110 is formed by adjusting the first thickness on the basis of the correspondence between the first thickness and the second thickness. Thus, the fuse film 120 and the internal terminal groups 130 can be appropriately controlled to be a desired thickness.

Figure 19:
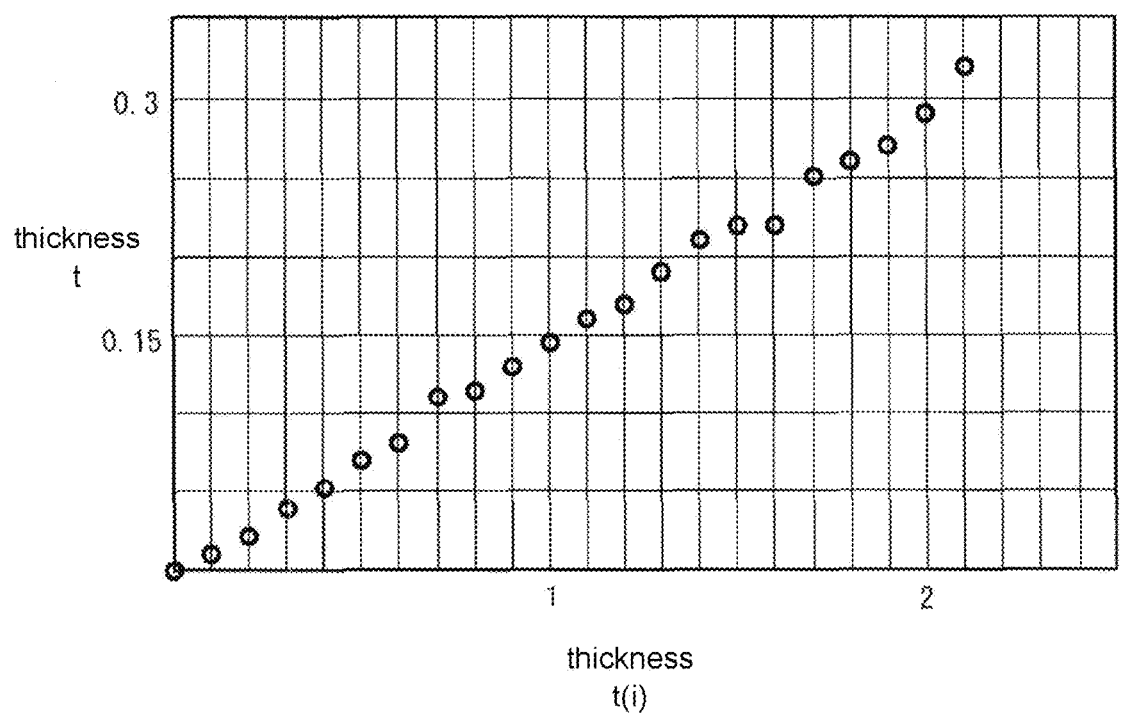
FIG. 19 is a graph showing the relationship between the thickness t(i) of the ink film 110 before laser irradiation and the thickness t of the fuse film 120 after irradiation.

FIG. 19 is a graph showing the relationship between the thickness t(i) of the ink film 110 before laser irradiation and the thickness t of the fuse film 120 after irradiation. Here, the ink film 110 is an ink film containing silver nanoparticles and is formed on a polyimide substrate. As can be seen from the graph, the thickness t(i) of the ink film 110 and the thickness t of the fuse film 120 are in proportion to each other, and the thickness t after irradiation can be controlled by controlling the thickness t(i) before irradiation.

It should be noted that similar results were obtained in experiments using an inkjet instead of a spin coater. In other printing methods such as flexographic printing and gravure printing, it was confirmed that the thickness t of the fuse film 120 after irradiation could be controlled by controlling the thickness t(i) of the ink film 110.

Figure 20:
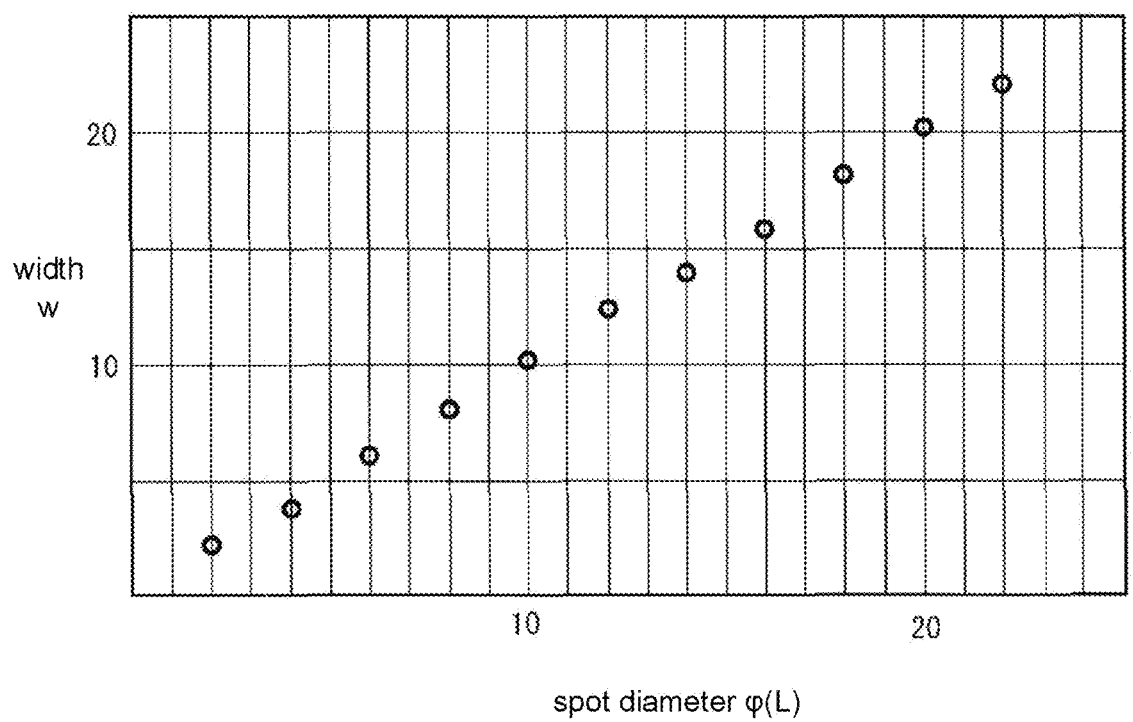
FIG. 20 is a graph showing the relationship between a spot diameter φ of the laser light and the width w of the fuse film 120.

FIG. 20 is a graph showing the relationship between the spot diameter φ(L) of the laser light and the width w of the fuse film 120. As shown in the graph, the width w of the fuse film 120 after irradiation and the spot diameter φ(L) are proportional to each other. It should be noted that the spot diameter φ(L) was obtained by measuring with a beam profiler, or measuring the shape of the trace processed by actually irradiating the substrate with the laser light.

In the present exemplary embodiment, the control part 210 may radiate the laser light onto the ink film 110 while adjusting at least one of the radiation speed and the radiation intensity of the laser light according to the thickness of the ink film 110. As a result, the fuse film 120 and the internal terminal groups 130 having a desired thickness can be formed even when the set value of the thickness of the ink film 110 is changed. Further, the fuse film 120 and the internal terminal groups 130 can be firmly bonded to the composite substrate 100.

In the present exemplary embodiment, as described above, the laser light oscillated from the laser oscillator 224 is attenuated by the optical filter 234 for attenuation, and the attenuated laser light is applied to the ink film 110. Oscillation of the laser light tends to be unstable when the output of the power supply 222 is made smaller than a predetermined value. It is possible to secure a desired radiation intensity by attenuating the light amount with the optical filter 234 instead of making the output of the power supply 222 smaller than necessary. This makes it possible to suppress the instability of oscillation of the laser light, and so the ink film 110 (the fuse film 120 and the internal terminal groups 130) after irradiation can be adequately bonded to the composite substrate 100.

It should be noted that, the linear fuse film 120 is formed as in the above description, but it is not so limited, and may be formed as a curved fuse film, for example. The curved fuse film can be formed by providing a galvanometer mirror on the optical part 230 and scanning with the laser light. Alternatively, a fuse film combining a linear fuse film and a curved fuse film may be formed. As a result, a fuse having the fuse film 120 having various shapes can be produced.

(Cleaning Process S108)

Returning to FIG. 13, in the cleaning process, the ink on the ink film 110 that is not irradiated with the laser light is washed away and a portion on the ink film 110 irradiated with the laser light is dried. It should be noted that, as a cleaning method, for example, ultrasonic cleaning with an isopropyl alcohol solution is used.

After cleaning, the electric resistance R between adjacent internal terminals (for example, the internal terminal 131a and the internal terminal 132a) may be measured. By using the measured electric resistance R, the resistivity ρ can be obtained with the following expression (6). It should be noted that, for the measurement of the electric resistance R, a known four-terminal method was used.

$$\rho = R \cdot t \cdot w / L \qquad (6)$$

(Firing Process S110)

In the firing process, the composite substrate 100 on which the fuse film 120 and the internal terminal groups 130 are formed is fired at about 250° C. for 1 hour by using, for example, a blower furnace. After firing, the electric resistance R between the adjacent terminals may be measured to obtain the resistivity p. From the measurement results, the variation in the resistivity after the firing process is improved over the variation in the resistivity after the cleaning process.

In particular, when the spot shape of the laser light is circular, the sintering of the metal nanoparticles at both end portions of the scanning area of the laser light is insufficient, and the resistivity at both end portions tends to be high. On the other hand, it was found that, by performing the firing, the variation in the resistivity was reduced and sintering of the metal nanoparticles was sufficiently performed at both end portions. In the present exemplary embodiment, the resistivity ρ after firing was 4.5 (μΩcm).

(Post Process S112)

In the post process, the overcoat and the external terminal are mainly formed. In the following, details of the post process are described with reference to FIG. 21.

Figure 21:
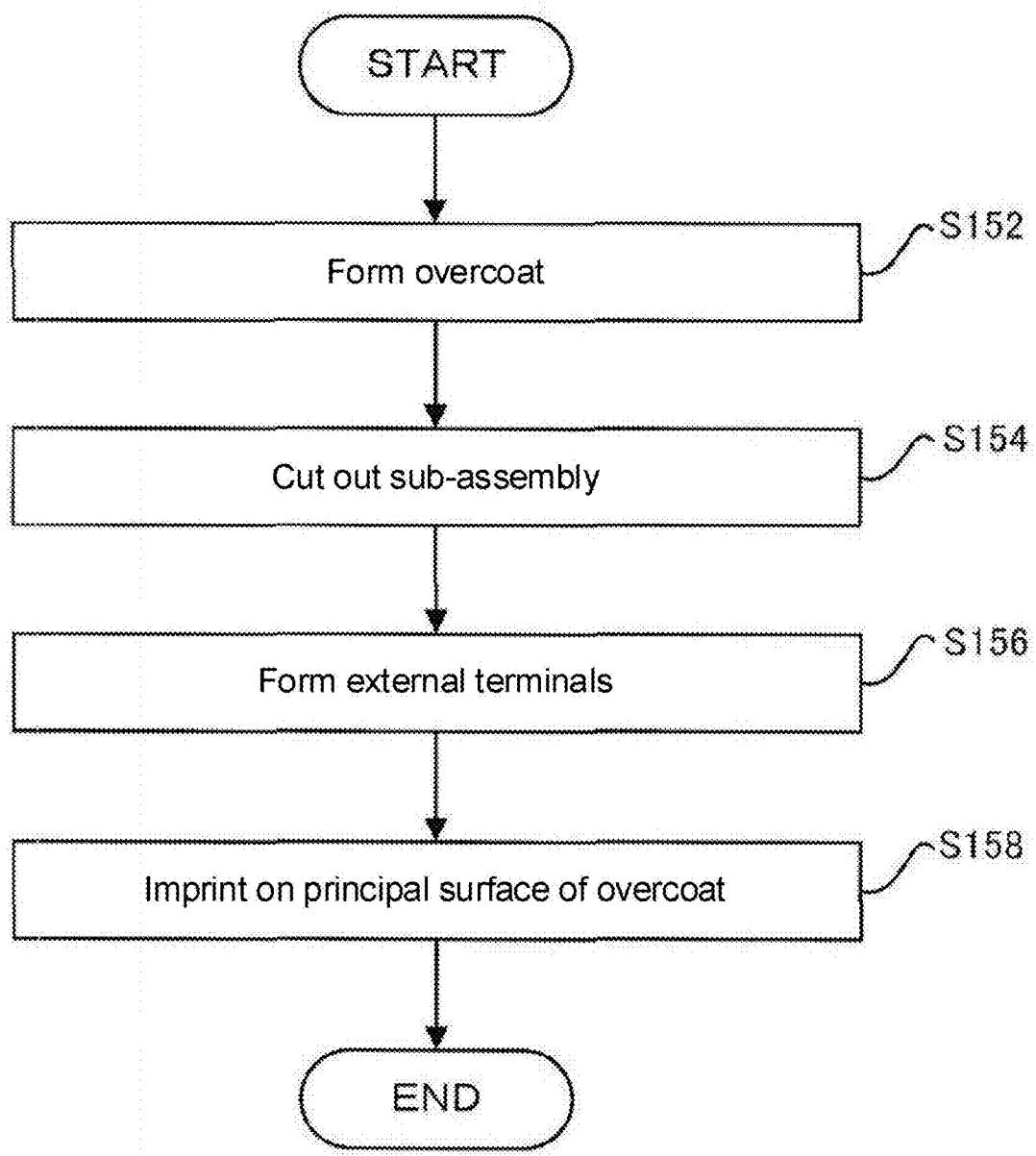
FIG. 21 is a flowchart showing the details of the post process.
Figure 22:
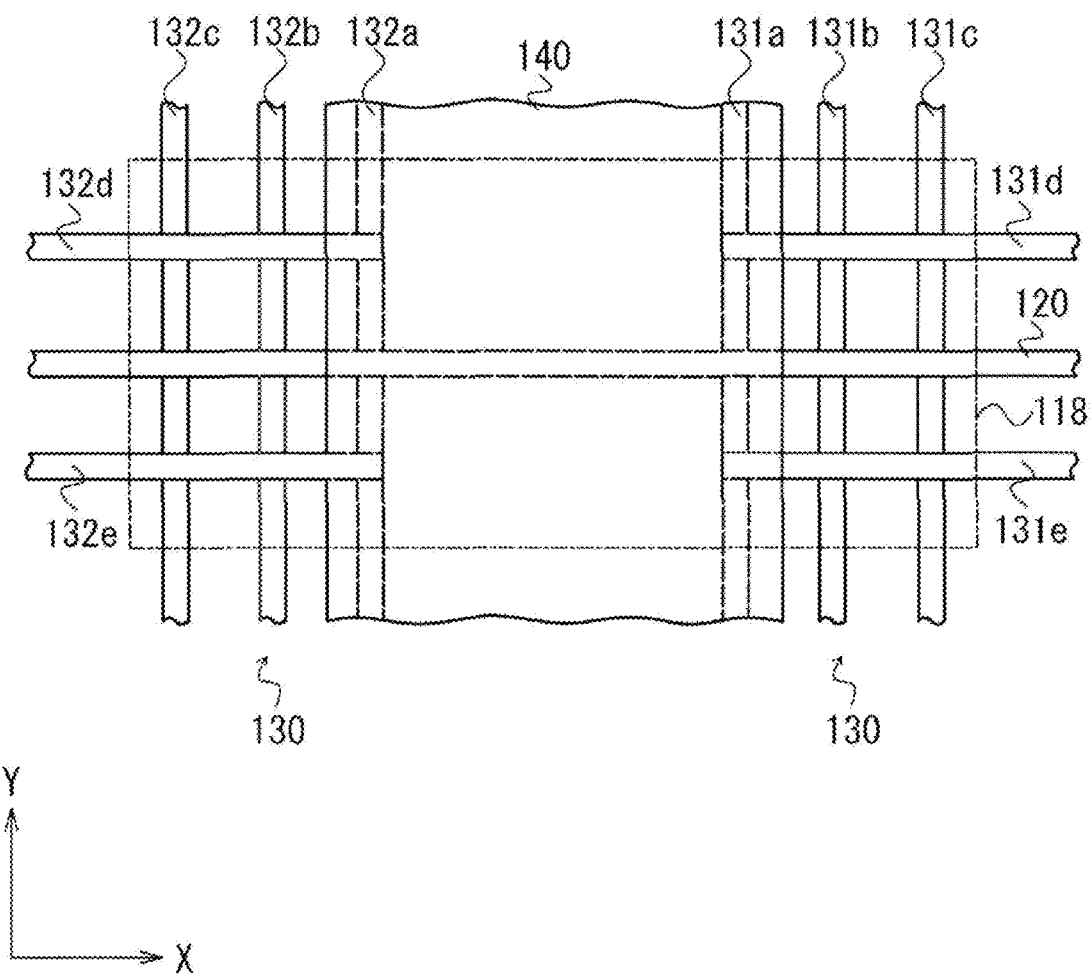
FIG. 22 is a diagram showing a formation state of an overcoat 140 on a sub-assembly 118.

FIG. 21 is a flowchart showing details of the post process. First, as shown in FIG. 22, an overcoat 140 is formed on the sub-assembly 118 (step S152). The overcoat 140 is formed by determining the positions of the respective sub-assemblies 118 on the composite substrate 100 on the basis of the aforementioned origin (the position of the alignment mark 115a).

FIG. 22 is a diagram showing a formation state of the overcoat 140 on the sub-assembly 118. The overcoat 140 is formed to coat the position near the center in the longitudinal direction of the fuse film 120. The overcoat 140 is mainly made of silicone resin. The overcoat 140 is formed using, for example, screen printing. Specifically, the overcoat 140 is formed by heating and curing the resin at a predetermined temperature after printing.

Returning to FIG. 21, the sub-assembly 118 having the overcoat 140 formed thereon is cut out from the composite substrate 100 (step S154). Next, as shown in FIG. 23, external terminals 151 and 152 connected to the internal terminals are formed on both end portions in the longitudinal direction of the sub-assembly 118 (step S156).

Figure 23:
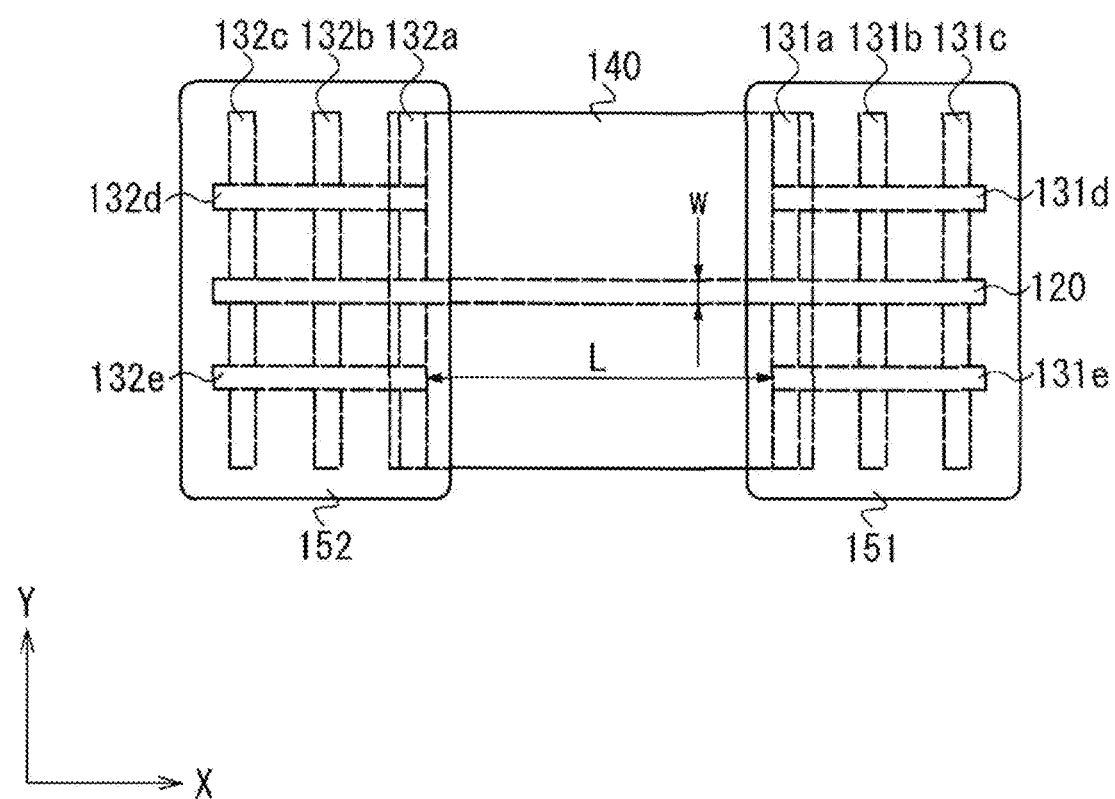
FIG. 23 is a diagram showing a formation state of external terminals 151 and 152.

FIG. 23 is a diagram showing a formation state of the external terminals 151 and 152. The external terminals 151 and 152 are formed to connect with portions of the internal terminal groups 130 that are not coated by the overcoat 140. The external terminals 151 and 152 are mainly composed of silver. The external terminals 151 and 152 are formed by printing and forming a silver paste that is an organic solvent, in which silver particles are dispersed, by using a screen printing technique or a dipping technique and then firing the silver paste under predetermined heating conditions.

In the present exemplary embodiment, the bonding strength between the internal terminal groups 130 and the external terminals 151 and 152 is high. This is because i) the electrical and mechanical bonding between the silver nanoparticles constituting the internal terminal groups 130 and the silver particles constituting the external terminals 151 and 152 is secured and ii) the mechanical bonding between the organic solvent, in which silver nanoparticles are dispersed, and the organic solvent, in which silver particles are dispersed, is secured.

Figure 24:
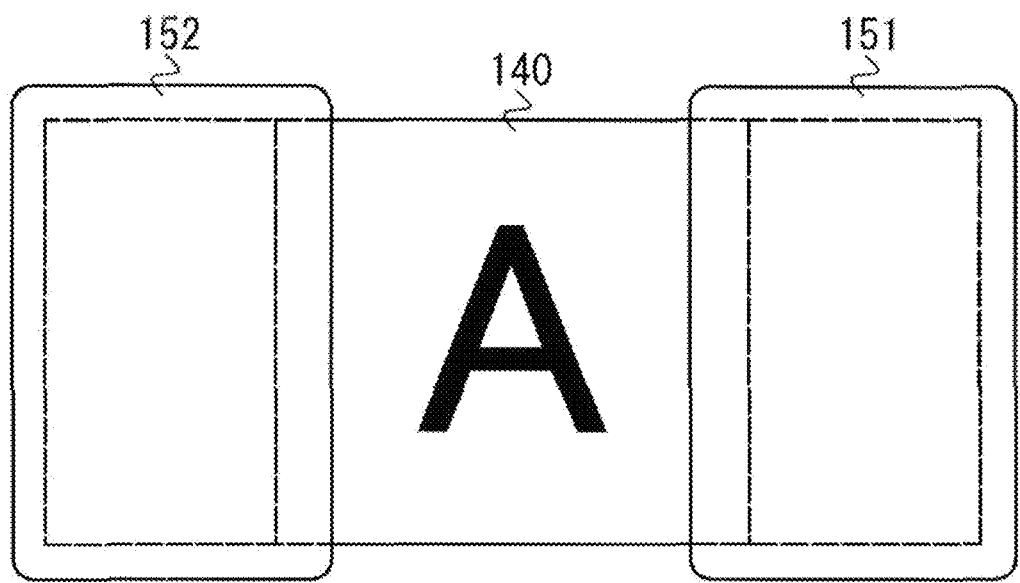
FIG. 24 is a diagram for describing the stamping of a seal on the overcoat 140.

By forming the external terminals 151 and 152, the product-type fuse 1 is formed. Returning to FIG. 21, the surface of the overcoat 140 is stamped with a seal as shown in FIG. 24 (step S158). FIG. 24 is a diagram for describing the stamping of a seal on the overcoat 140. For example, a character is stamped on the surface of the overcoat 140. It should be noted that, after stamping a seal the overcoat 140, Ni plating or Sn plating may be applied to the external terminals 151 and 152.

(Inspection Process S114)

Returning to FIG. 13, in the inspection process, the resistance and the like of the fuse 1 are inspected. After the inspection, the fuse 1 is packed and shipped. A series of production processes of the fuse 1 according to the present exemplary embodiment is completed.

In the production method of the fuse 1 described above, after the ink film 110 containing the metal nanoparticles is formed on the substrate, the fuse film 120 is formed by irradiating the ink film 110 with the laser light. In such a case, it is possible to inexpensively produce a large amount of the fuses 1 having a fine thin fuse film without using patterned ground processing, a patterned mask, or the like of a fuse film.

Further, according to the above-described production method of the fuse 1, the fuse film 120 and the internal terminal groups 130 formed on the polyimide composite substrate 100 by heating the ink film 110 with the laser light are reliably bonded to the surface of the composite substrate 100 by forming the entering parts respectively. The bonding strength at the bonding interface is larger than the misalignment force F at the bonding interface generated due to the difference in linear expansion coefficients among the composite substrate 100 (the support substrate after production), the fuse film 120, and the internal terminal groups 130 when the temperature of the fuse 1 changes due to a heat cycle test or the like, and so peeling at the bonding interface can be prevented. As a result, it is possible to improve the pulse life and the heat cycle reliability of the fuse 1.

It should be noted that, in the above-described production method of the fuse 1, step S102 corresponds to a liquid film forming step, step S138 corresponds to a heating step, and step S140 corresponds to a fuse film forming step.

4. Variation

In the above description, the spin coater is used to form the ink film 110 containing metal nanoparticles on the entire surface 102 of the composite substrate 100, but it is not so limited. For example, an ink film may be formed on a portion of the surface 102 where the fuse film 120 is to be formed, using an ink jet printer.

Further, in the above description, the metal nanoparticles are silver nanoparticles, but it is not so limited. For example, the metal nanoparticles may be other metal nanoparticles such as copper nanoparticles, gold nanoparticles, and nickel nanoparticles. Furthermore, in the above description, the average particle diameter of metal nanoparticles is about 15 (nm), but it is not so limited. For example, the average particle size of metal nanoparticles may be, for example, 3 (nm) or 50 (nm).

Moreover, in the above description, the support substrate 10 is a non-thermoplastic polyimide substrate, but it is not so limited. For example, the support substrate 10 may be any of a thermoplastic polyimide substrate, a thermosetting polyimide substrate, a polyetheretherketone (PEEK) substrate, or a substrate made of other organic materials.

Further, in the above description, the internal terminal groups 31 and 32 include the internal terminals 31d, 31e, 32d, and 32e respectively connecting the internal terminals 31a to 31c and 32a to 32c, but is not so limited and the internal terminal groups 31 and 32 do not have to respectively include 31d, 31e, 32d, and 32e.

Furthermore, in the above description, the external terminals 51 and 52 are respectively in contact with the internal terminals of the internal terminal groups 31 and 32, so as to be electrically connected, but it is not so limited. For example, the external terminals 51 and 52 may be electrically connected to the internal terminals through flat plate-like intermediate terminals provided between the external terminals 51 and 52 and the internal terminal groups 31 and 32.

Moreover, in the above description, the laser light is Nd-YAG laser light having a wavelength of 1064 (nm) and an average radiation intensity of $3.0 \times 10^4$ to $5.0 \times 10^5$ (W/cm$^2$), or Nd-YAG laser light having a wavelength of 532 (nm) and an average radiation intensity of $2.0 \times 10^3$ to $7.0 \times 10^4$ (W/cm$^2$), but it is not so limited. For example, the laser light may be titanium sapphire laser light having a wavelength of 800 (run) that the metal nanoparticles have a plasmon absorption band. Further, the magnitude of the average radiation intensity of the laser light may be adjusted according to the wavelength of the laser light.

Furthermore, in the above description, the laser light is radiated in the continuous oscillation mode, but it is not so limited and the laser light may be radiated in, for example, the pulse oscillation mode. Moreover, in the above description, the scanning speed of the laser light is set to 3 to 90 (mm/s), but it is not so limited.

Further, in the above description, the spot shape of the laser light is circular, but it is not so limited. For example, the spot shape of the laser light may be any of an elliptical shape, a square shape, and a rectangular shape. When the spot shape is square or rectangular, it is possible to sinter across substantially the entire radiation width of the laser light. Furthermore, in the above description, the diameter of the laser light having the circular spot shape is 10 (μm), but it is not so limited. The diameter of the laser light may be adjusted according to the wavelength and the radiation intensity of the laser light.

Moreover, in the above description, one linear fuse film 20 is formed, but it is not so limited. For example, a curved fuse film 20 may be formed and a plurality of fuse films 20 may be formed. Further, in the above description, the thicknesses of the fuse 20 and the internal terminal groups 31 and 32 are set to 0.1 (μm) to 3.0 (μm), but they are not so limited.

Furthermore, in the above description, the ink film is heated by irradiating the ink film 110 with the laser light, but it is not so limited. For example, the ink film 110 may be heated by known microwave heating or induction heating. However, in order to intensively heating the ink film 110 in a short time to prevent deformation of the composite substrate 100 (a support substrate), a method of radiating the laser light is effective.

5. Configuration of Circuit Board

Figure 25:
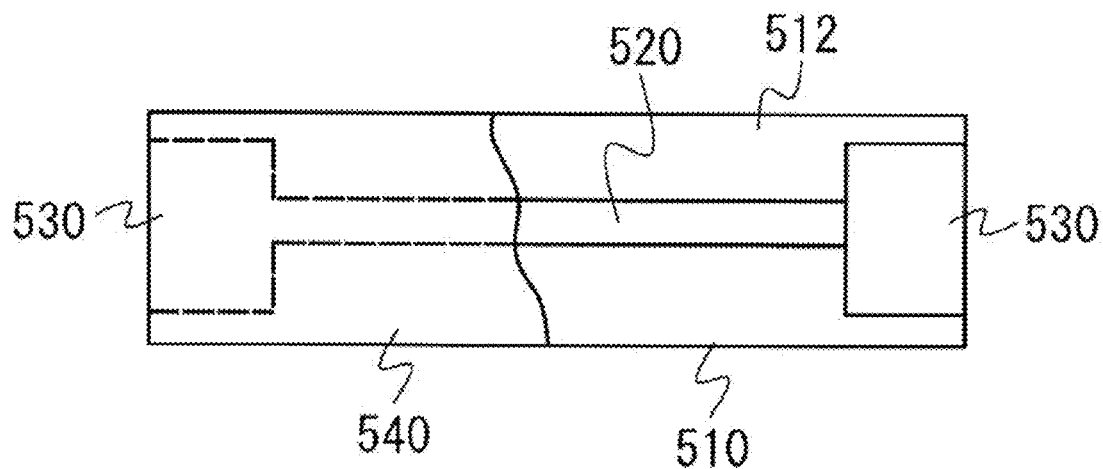
FIG. 25 is a schematic cross-sectional view of a circuit board 500 according to one exemplary embodiment of the present invention.
Figure 25:
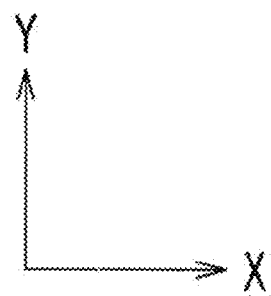
Figure 26:
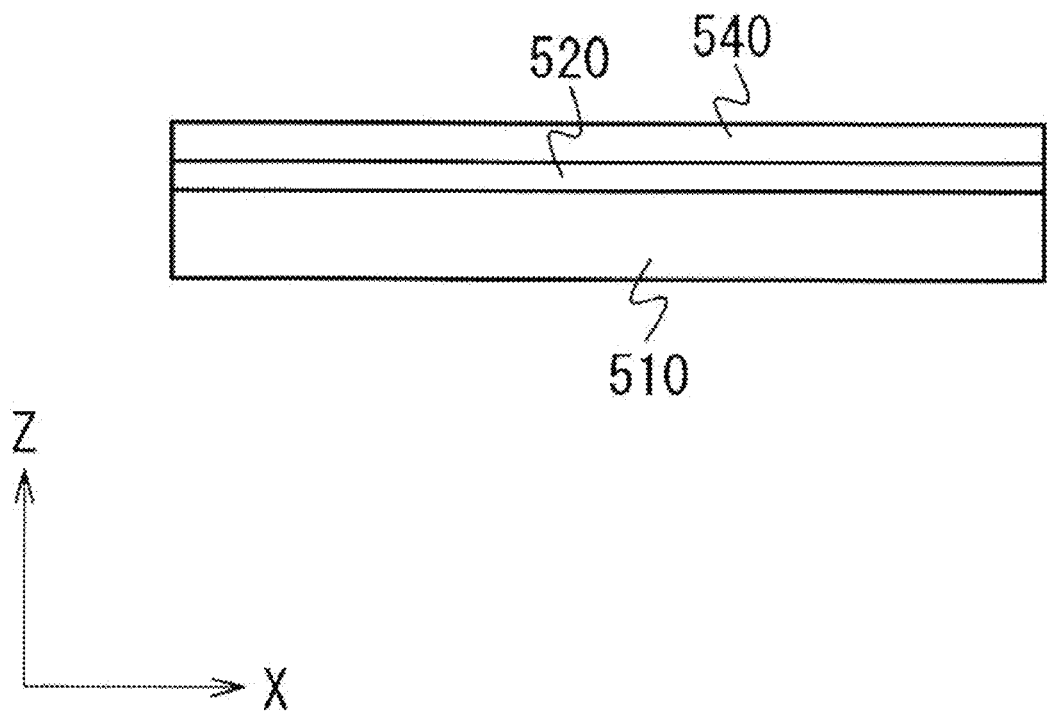
FIG. 26 is a schematic planar view of the circuit board 500.

With reference to FIG. 25 and FIG. 26, a configuration of a circuit board 500 according to one exemplary embodiment of the present invention is described.

The circuit board 500 of the present exemplary embodiment is a flexible circuit board having flexibility to be incorporated in a movable device (for example, a foldable portable terminal that can be opened and closed). The circuit board 500 is provided, for example, inside of a hinge part of the portable terminal, and is bent in conjunction with the opening and closing of the portable terminal. Further, the circuit board 500 may be provided on a wearable terminal that is weight-reduced and downsized to be worn by a user.

When the above-described circuit board incorporated in the movable device is repeatedly bent, the following problems occur. That is, when the circuit board is repeatedly bent, cracks are generated in the circuit part (a circuit pattern) bonded to the substrate of the circuit board and the circuit part is divided, which increases the resistance value of the circuit part. Further, when the circuit board is repeatedly bent, the circuit part is peeled from the substrate and the circuit board may be damaged. On the other hand, the circuit board 500 according to the present exemplary embodiment is configured to be able to suppress the occurrence of the above-described problems even when it is repeatedly bent.

FIG. 25 is a schematic cross-sectional view of the circuit board 500 according to one exemplary embodiment. FIG. 26 is a schematic planar view of the circuit board 500. As shown in FIG. 25 and FIG. 26, the circuit board 500 includes a substrate 510, a circuit part 520, terminals 530, and a coating part 540.

The substrate 510 supports the circuit part 520 and the terminals 530. The substrate 510 is made of, for example, an organic compound having excellent flexibility. Here, the substrate 510 is a non-thermoplastic polyimide resin substrate. The thickness of the substrate 510 is about 250 (μm).

The circuit part 520 is a circuit pattern made of conductor and is bonded to a principal surface 512 of the substrate 510. Like the fuse film 20 of the fuse 1 described above, the circuit part 520 is formed on the principal surface 512 by irradiating the ink film containing metal nanoparticles with the laser light. For example, silver nanoparticles are used as metal nanoparticles. The thickness of the circuit part 520 is about 0.25 (μm), and the length of the circuit part 520 is about 10 (mm).

The circuit part 520 includes a circuit side entering part that enters the inside of the substrate 510 from a bonding surface with the principal surface 512. A plurality of circuit side entering parts is dispersedly formed by fusions of metal nanoparticles with the principal surface 512 of the substrate 510, the metal nanoparticles being melted or sintered by being irradiated with the laser light at the time of forming the circuit part 520. The circuit side entering part is engaged with the inside of the substrate 510. The shape of the circuit side entering part is the same as the shape of the above-described entering part 22 of the fuse film 20, and so a detailed description thereof will be omitted. Because the circuit side entering part is formed, the circuit part 520 is firmly bonded to the substrate 510, and the circuit part 520 becomes resistant to being peeled from the principal surface 512 of the substrate 510. Further, because the circuit part 520 is firmly bonded to the substrate 510, cracks are less likely to be generated in the circuit part 520, and so an increase in the resistance value of the circuit part 520 can be suppressed.

Here, the mechanism of peeling the circuit part from the substrate is described by taking the circuit board of comparative example 4 as an example. The circuit part of the circuit board according to comparative example 4 is formed by firing an ink film in a blower furnace without irradiating the ink film corresponding to the circuit part with the laser light. Therefore, a circuit side entering part is not formed in the circuit board of comparative example 4 unlike the circuit part 520 of the present exemplary embodiment. The circuit board according to comparative example 4 is bent in accordance with the rotation of the device in which a rotating substrate is incorporated. When the circuit board is repeatedly bent, a misalignment force is repeatedly generated in a direction along the bonding interface at the bonding interface between the circuit part and the substrate, and so the circuit part is deviated from the principal surface of the substrate due to the misalignment force and the circuit part peels from the principal surface of the substrate. It should be noted that the misalignment force acts as a compressive force on a member having a large radius of curvature and acts as a tensile force on a member having a small radius of curvature of the two bonded members at the bonding interface. That is, in a bent state where the radius of curvature of the substrate is larger than the radius of curvature of the circuit part, a tensile force acts on the bonding surface of the circuit part and a compressive force acts on the principal surface of the substrate.

On the other hand, in the present exemplary embodiment, because the circuit side entering part is formed in the circuit part 520, the circuit part 520 is bonded to the substrate 510 by the bonding force that is larger than the above-mentioned misalignment force. Therefore, since it is hard for the circuit part 520 to be displaced from the substrate 510 even when the circuit board 500 is repeatedly bent, peeling of the circuit part 520 from the substrate 510 can effectively be prevented.

The substrate 510 also includes a substrate side entering part that enters the inside of the circuit part 520 from the principal surface 512. A plurality of substrate side entering parts is dispersedly formed and is engaged with the inside of the circuit part 520. In this way, since the substrate side entering part is formed in addition to the circuit side entering part, it is possible to further strengthen the bonding between the circuit part 520 and the substrate 510.

The terminals 530 are formed at each end of the circuit part 520 in the longitudinal direction and are bonded with the principal surface 512 of the substrate 510. The terminals 530 are connected to the both ends in the longitudinal direction of the circuit part 520. Here, the terminals 530 are made of silver like the circuit part 520. The terminal 530 may be formed by irradiating the ink film with the laser light like the circuit part 520, or may be formed by screen printing or the like. Because an entering part is formed like the circuit part 520 when the terminal 530 is made by irradiating the ink film with the laser light, the terminals 530 are firmly bonded to the substrate 510.

The coating part 540 coats the circuit part 520 and the terminals 530. The coating part 540 is, for example, a laminate film having high gas barrier properties.

As described above, in the circuit board 500 according to the present exemplary embodiment, the circuit part 520 is firmly bonded to the substrate 510 because the circuit side entering part and the substrate side entering part are formed. As a result, even when the circuit board 500 is repeatedly bent, an increase in the resistance value of the circuit part 520 can be suppressed, and the circuit part 520 is less likely to be peeled from the substrate 510.

Here, the relationship between i) the resistance value and the peeling strength before the bending test, in which the circuit board 500 according to the present embodiment is repeatedly bent a predetermined number of times (here, 3000 times), and ii) the resistance value and the peeling strength after the bending test is described in comparison with the circuit board according to comparative examples 4 and 5. The circuit board according to comparative example 4 is a circuit board in which a silver circuit part is formed on the principal surface of a polyimide substrate by vacuum deposition. The fuse according to comparative example 5 is a circuit board whose circuit part is formed by printing a dispersion liquid, in which silver nanoparticles with a size of about 15 (nm) are dispersed, on the principal surface of a polyimide substrate and drying and firing the substrate in a blower furnace.

The following table 2 shows the resistance values of the circuit board before the bending test and after the bending test.

TABLE 2

|  | Resistance before bending (Ω) | Resistance after bending (Ω) |
| --- | --- | --- |
| Present exemplary embodiment | 7.56 | 7.60 |
| Comparative example 4 | 0.25 | 0.43 |
| Comparative example 5 | 0.61 | 2.44 |

As can be seen from the table 2, the resistance values of the circuit boards according to comparative examples 4 and 5 after the bending test are greatly increased as compared with the resistance values before the bending test. On the other hand, the resistance value of the circuit board 500 according to the present exemplary embodiment after the bending test is only slightly increased from the resistance value before the bending test, and the resistance hardly increases.

The following table 3 shows the peeling strength of the circuit part before the bending test and after the bending test.

TABLE 3

|  | Peeling strength before bending (KN/m) | Peeling strength after bending (KN/m) |
| --- | --- | --- |
| Present exemplary embodiment | 3.1 | 3.1 |
| Comparative example 4 | 0.37 | 0.08 |
| Comparative example 5 | 1.12 | 0.80 |

As can be seen from the table 3, the peeling strengths of the circuit parts of the circuit boards according to comparative examples 4 and 5 after the bending test is smaller than the peeling strength before the bending test. On the other hand, the peeling strength of the circuit part 520 of the circuit board 500 according to the present exemplary embodiment after the bending test is the same as the peeling strength before the bending test. As a result, it was confirmed that the circuit part 520 according to the present exemplary embodiment was not peeled from the substrate 510.

It should be noted that the bending test of the circuit board was carried out in accordance with the "Test method of folding endurance" specified in JIS P8115. As a test condition, the bending radius that the circuit board bends is 6 (mm), the bending angle is 90 (degrees), the bending speed is 120 (reciprocating/minute), and the tensile load is 1 (N). Further, the lengths in the longitudinal direction of the circuit board 500 used for the bending test and the circuit boards of comparative examples 4 and 5 are each about 20 (mm). It should be noted that the width (Y direction in FIG. 25) of the circuit board 500 used for the bending test was 300 (μm), whereas the widths of the circuit boards of comparative examples 4 and 5 were each 10 (mm).

In the present exemplary embodiment, the circuit side entering part of the circuit part 520 corresponds to a first entering part, and the substrate side entering part of the substrate 510 corresponds to a second entering part. In the above description, both of the circuit side entering part and the substrate side entering part are formed, but it is not so limited. At least any one of the circuit side entering part and the substrate side entering part may be formed. In such a case, the circuit part 520 can be firmly bonded to the substrate 510.

In the above description, the substrate 510 is a substrate made of an organic compound, but it is not so limited. For example, the substrate 510 may be a substrate in which an organic compound and an inorganic compound are combined. In such a case, it is desirable that the proportion of the organic compound is larger than the proportion of the inorganic compound.

6. Circuit Board Production Method

Figure 27:
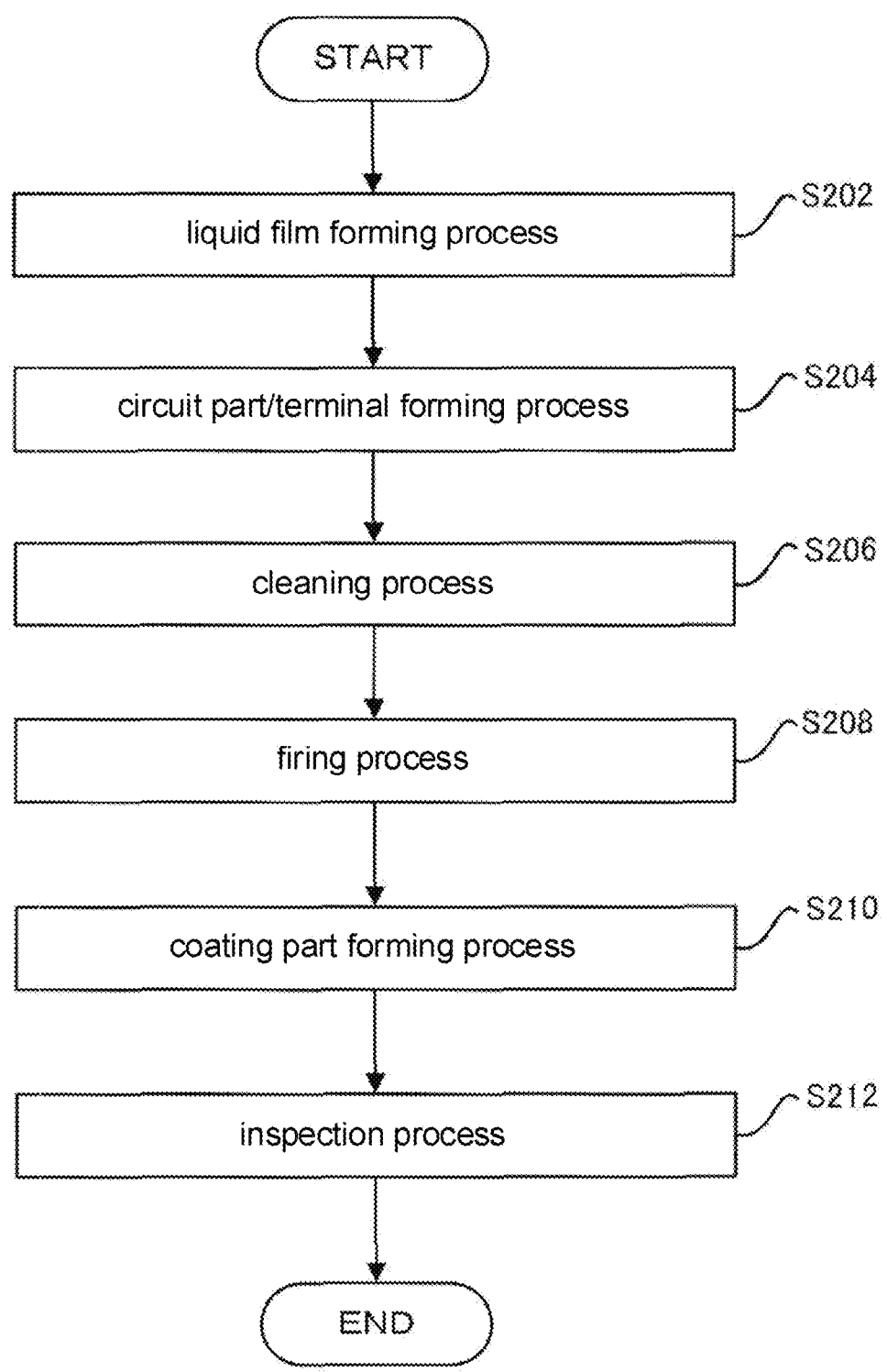
FIG. 27 is a flowchart showing a production process of the circuit board 500.

With reference to FIG. 27, an example of a production method of the circuit board 500 is described. FIG. 27 is a flowchart showing a production process of the circuit board 500. It should be noted that the same process as the production process of the fuse 1 shown in FIG. 13 is briefly described here because a similar process is performed therein.

In the liquid film forming process S202, an ink film that is a liquid film of a dispersion liquid, in which metal nanoparticles (silver nanoparticles) are dispersed in a solvent, is formed on the principal surface 512 of a polyimide substrate 510. After the ink film is formed, the ink film may be dried.

Next, in the circuit part/terminal forming process S204, the laser light irradiates the ink film to form the circuit part 520. At this time, the surface of the ink film is irradiated with the laser light to heat the ink film so as to vaporize the solvent constituting the ink film. As a result, silver nanoparticles in the ink film melt, and some of the silver nanoparticles are sintered together to form silver particles. Further, heat is transferred from the silver nanoparticles to the principal surface 512 of the substrate 510, and the principal surface 512 is heated. As a result, the principal surface 512 softens or melts substantially in a state of being isolated from the atmosphere.

After the irradiation of the laser light, the melted or sintered metal nanoparticles and the softened or melted principal surface 512 are fused with each other. That is, the melted or sintered metal nanoparticles contacts the softened or melted principal surface 512 to form a bonding interface including the circuit side entering part and the substrate side entering part described above.

Further, in the circuit part/terminal forming process S204, the terminal 530 that contacts with the circuit part 520 is formed. The terminal 530 may be formed by irradiating the ink film with the laser light like the circuit part 520, or may be formed by screen printing without being irradiated with the laser light.

Then, in the cleaning process S206, the ink on the ink film that is not irradiated with the laser light is washed away and the portion on the ink film 110 irradiated with the laser light is dried. In the firing process S208, the substrate 510 on which the circuit part 520 and the terminal 530 are formed is fired by using, for example, a blower furnace. In the coating part forming process S210, the coating part 540 is formed so as to coat the circuit part 520 and the terminal 530. As a result, the product type circuit board 500 is formed.

Next, in the inspection process S212, the circuit board 500 is inspected. After the inspection, the circuit board 500 is packed and shipped. A series of production processes of the circuit board 500 according to the present exemplary embodiment is completed.

In the production method of the circuit board 500 described above, the circuit part 520 is formed by irradiating the ink film with the laser light after forming the ink film on the circuit board 500. In such a case, it is possible to inexpensively produce a large amount of the circuit boards 500 without using patterned ground processing, patterned mask, or the like of the circuit part.

Further, according to the production method of the circuit board 500 described above, the circuit part 520 formed on the polyimide substrate 510 by heating the ink film with the laser light is reliably bonded to the surface of the substrate 510. As a result, even when the circuit board 500 is repeatedly bent, the circuit part 520 is resistant to being peeled from the substrate 510, and it is also possible to suppress a decrease in the pulse life.

The variation described with respect to the fuse 1 can be applied to the circuit board 500 of the present exemplary embodiment.

The present invention is explained with the exemplary embodiments of the present invention but the technical scope of the present invention is not limited to the scope described in the above embodiment. It is apparent for those skilled in the art that it is possible to make various changes and modifications to the embodiment. It is apparent from the description of the scope of the claims that the forms added with such changes and modifications are included in the technical scope of the present invention.

What is claimed is:

1. A fuse comprising:
   a substrate containing at least an organic substance;
   a fuse film that is connected to a principal surface of the substrate; and
   both a first entering part formed on a bonding interface of the fuse film and a second entering part formed on the principal surface of the substrate, the first entering part entering the inside of the substrate, and the second entering part entering the inside of the fuse film.

2. The fuse according to claim 1, wherein
   the first entering part is engaged with the inside of the substrate.

3. The fuse according to claim 2, wherein
   the first entering part has a hook shape.

4. The fuse according to claim 2, wherein
   a width of a distal end side of the first entering part is larger than a width of a root part side of the first entering part.

5. The fuse according to claim 1, wherein
   the substrate is a polyimide substrate.

6. The fuse according to claim 1, further comprising
   connection terminals connected to the principal surface of the substrate so as to be connected with the fuse film at each end of the fuse film in the longitudinal direction,
   wherein the thicknesses of the connection terminals are the same as the thickness of the fuse film.

* * * * *